(12) United States Patent
Matsumoto et al.

(10) Patent No.: US 11,552,004 B2
(45) Date of Patent: Jan. 10, 2023

(54) WIRING STRUCTURE HAVING STACKED FIRST AND SECOND ELECTRODES

(71) Applicant: Shinko Electric Industries, Co., Ltd., Nagano (JP)

(72) Inventors: Takayuki Matsumoto, Nagano (JP); Tsukasa Nakanishi, Nagano (JP); Yukinori Hatori, Nagano (JP)

(73) Assignee: SHINKO ELECTRIC INDUSTRIES CO., LTD., Nagano-ken (JP)

( * ) Notice: Subject to any disclaimer, the term of this patent is extended or adjusted under 35 U.S.C. 154(b) by 0 days.

(21) Appl. No.: 17/233,786

(22) Filed: Apr. 19, 2021

(65) Prior Publication Data
US 2021/0335695 A1    Oct. 28, 2021

(30) Foreign Application Priority Data
Apr. 22, 2020   (JP) .............................. JP2020-076034

(51) Int. Cl.
| | |
|---|---|
| *H01L 23/495* | (2006.01) |
| *H01L 23/48* | (2006.01) |
| *H01L 21/00* | (2006.01) |
| *H01R 9/00* | (2006.01) |
| *H05K 7/18* | (2006.01) |
| *H01L 21/56* | (2006.01) |
| *H01L 23/31* | (2006.01) |
| *H01L 21/48* | (2006.01) |

(52) U.S. Cl.
CPC .... *H01L 23/49524* (2013.01); *H01L 21/4825* (2013.01); *H01L 21/4828* (2013.01); *H01L 21/568* (2013.01); *H01L 23/3107* (2013.01); *H01L 23/4951* (2013.01); *H01L 23/49558* (2013.01); *H01L 23/49575* (2013.01)

(58) Field of Classification Search
CPC ........... H01L 23/49524; H01L 23/3107; H01L 23/4951; H01L 23/49558; H01L 23/49575; H01L 21/4825; H01L 21/4828; H01L 21/568; H01L 2924/181
See application file for complete search history.

(56) References Cited

U.S. PATENT DOCUMENTS

| | | | |
|---|---|---|---|
| 9,698,084 B2 * | 7/2017 | Kasahara | ........... H01L 23/49548 |
| 10,818,580 B2 * | 10/2020 | Hatori | ..................... H01L 24/84 |
| 10,943,857 B2 * | 3/2021 | Kaneko | ............... H01L 21/6835 |
| 10,986,732 B2 * | 4/2021 | Matsumoto | ........... H01F 27/292 |
| 2012/0227261 A1 | 9/2012 | Inui | |
| 2014/0247561 A1 | 9/2014 | Inui | |
| 2021/0153355 A1 * | 5/2021 | Matsumoto | ......... H01L 23/3107 |

FOREIGN PATENT DOCUMENTS

JP    2012191204 A    10/2012

* cited by examiner

*Primary Examiner* — Alonzo Chambliss
(74) *Attorney, Agent, or Firm* — Tarolli, Sundheim, Covell & Tummino LLP 3

(57) ABSTRACT

A wiring substrate includes a first metal plate and a second electrode. The first metal plate includes a first electrode, a wiring, and a mount portion for an electronic component. The mount portion includes an upper surface of the wiring. The second electrode is joined to an upper surface of the first electrode. The first electrode is solid. The second electrode is solid.

12 Claims, 24 Drawing Sheets

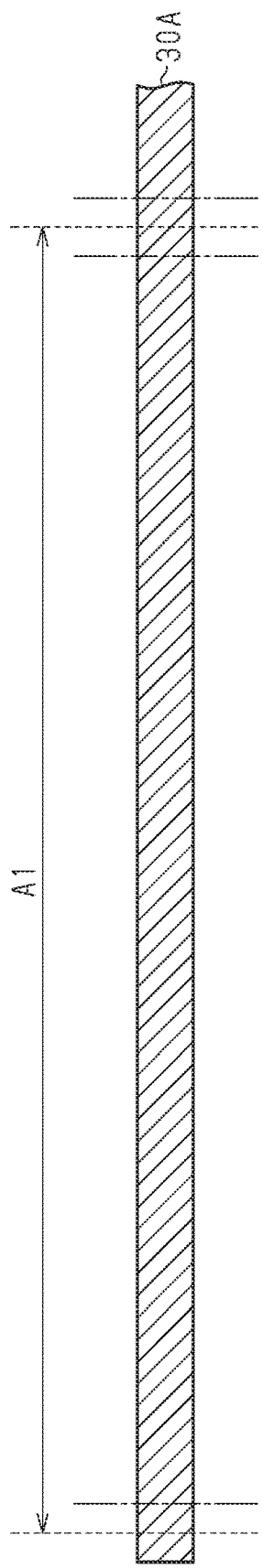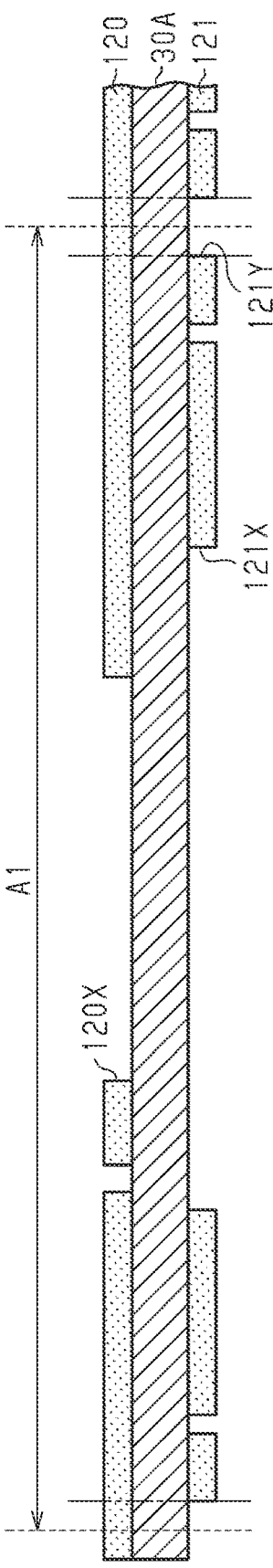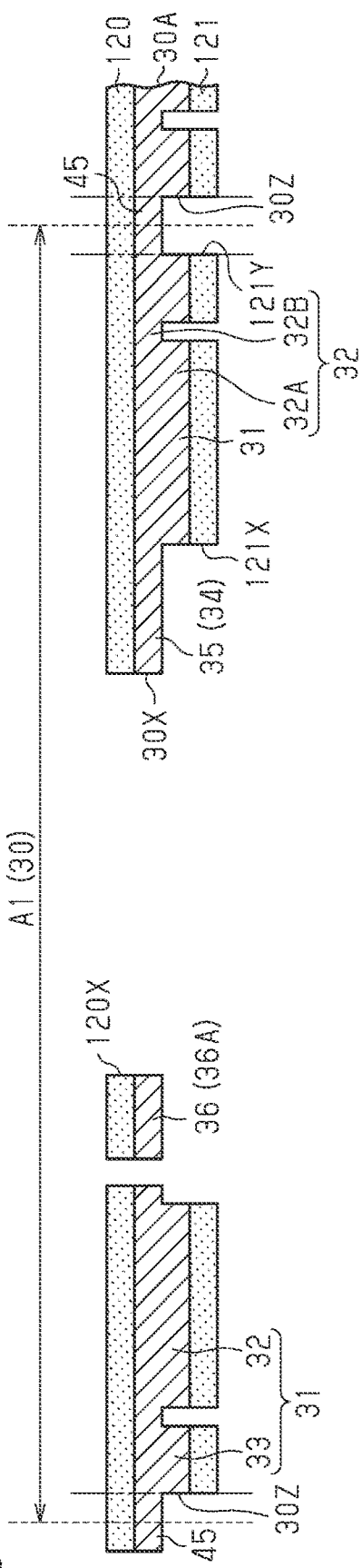

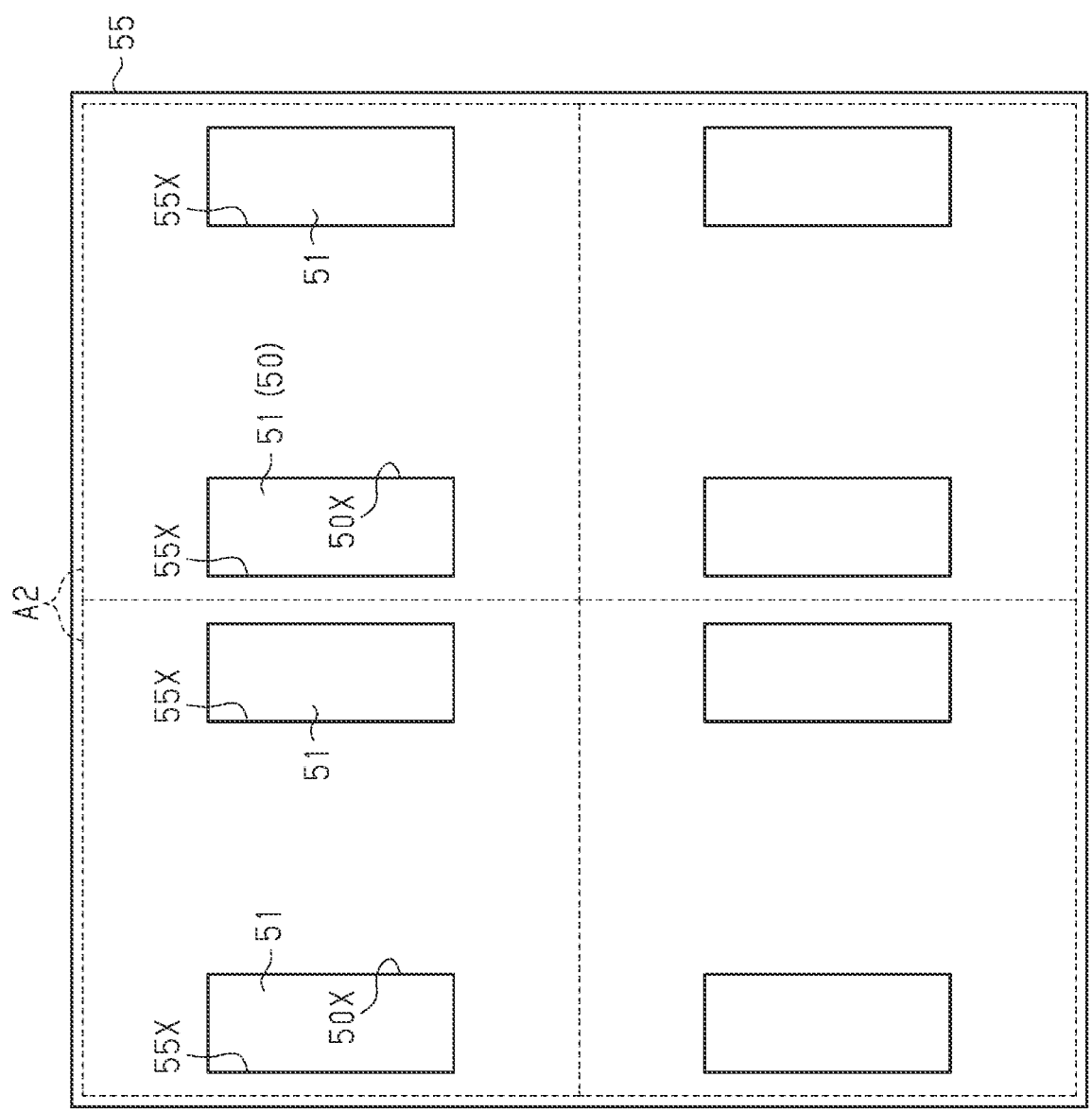

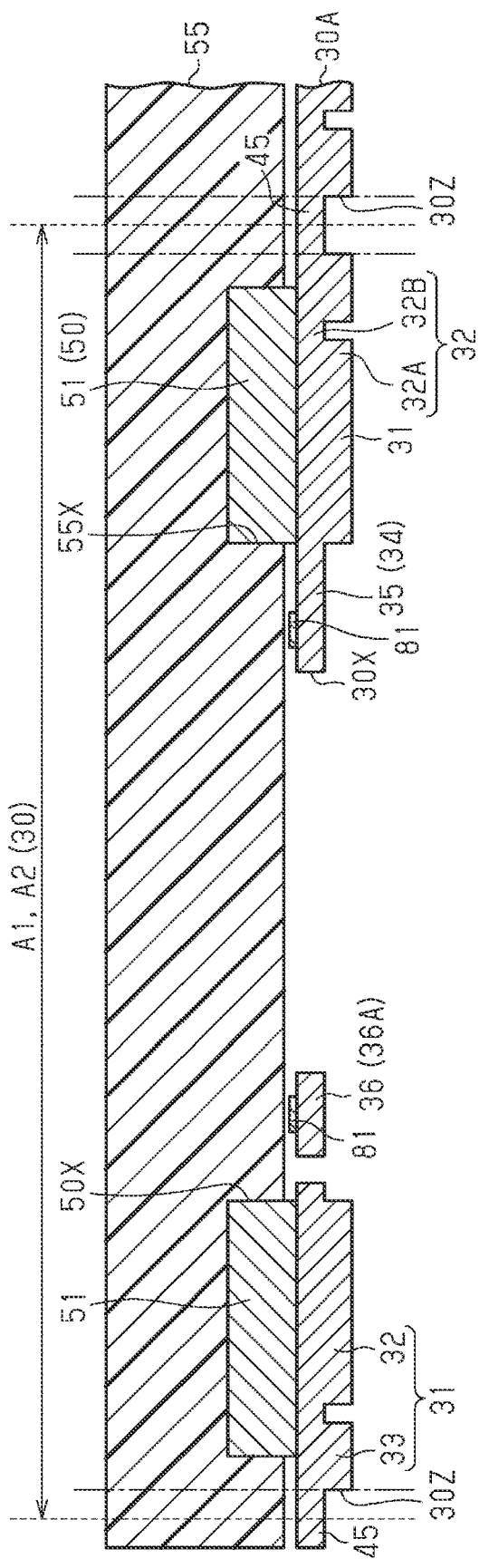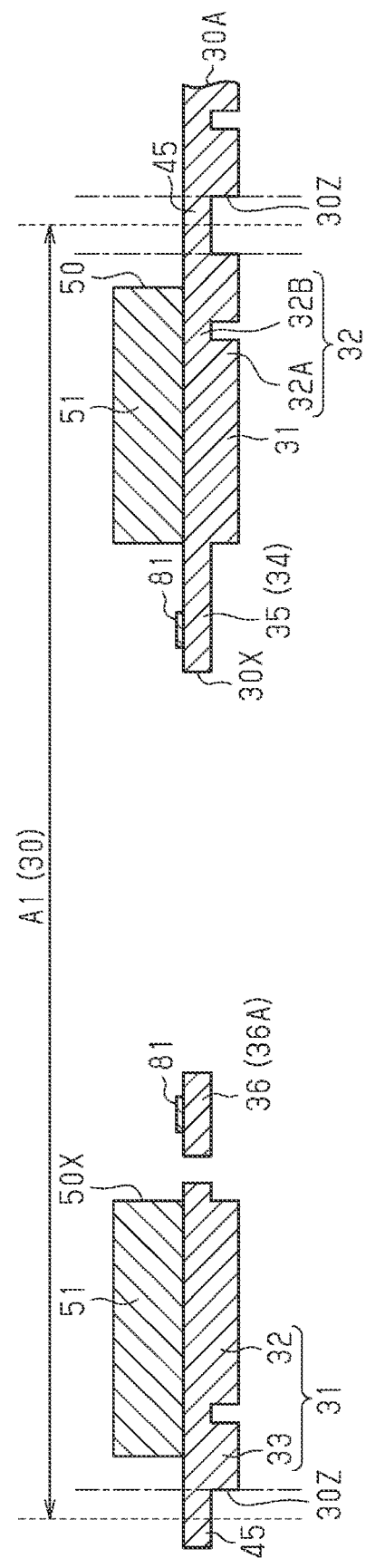

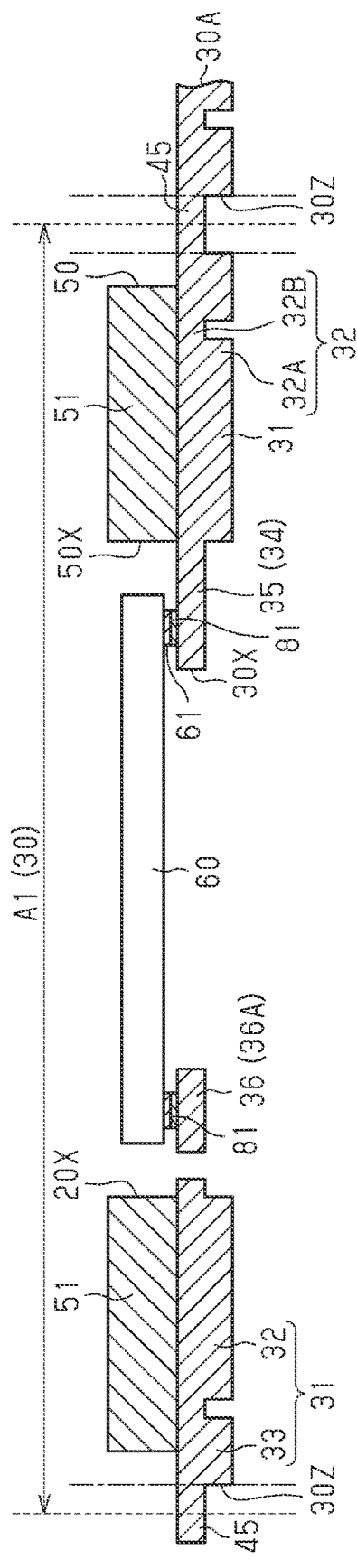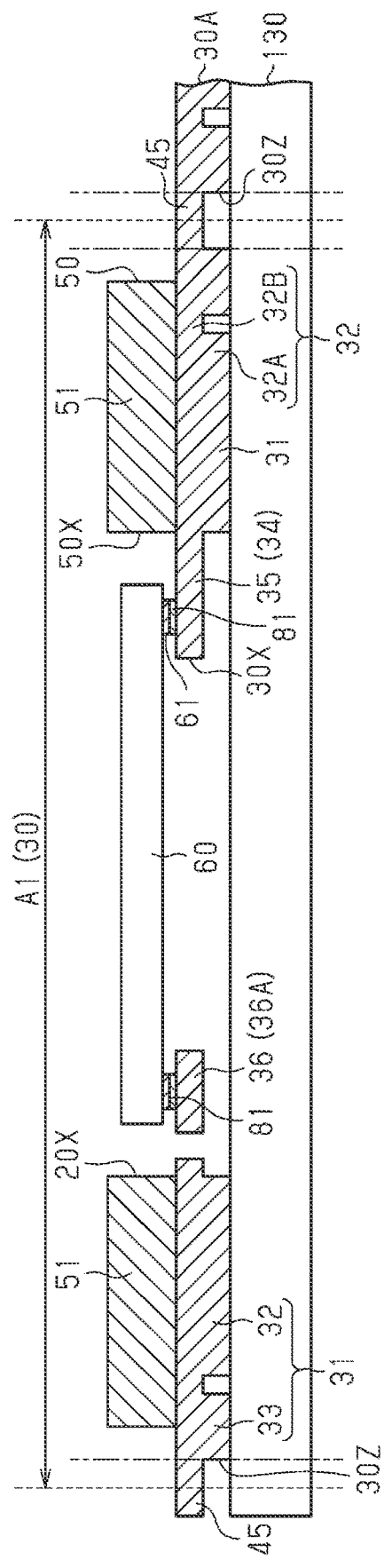

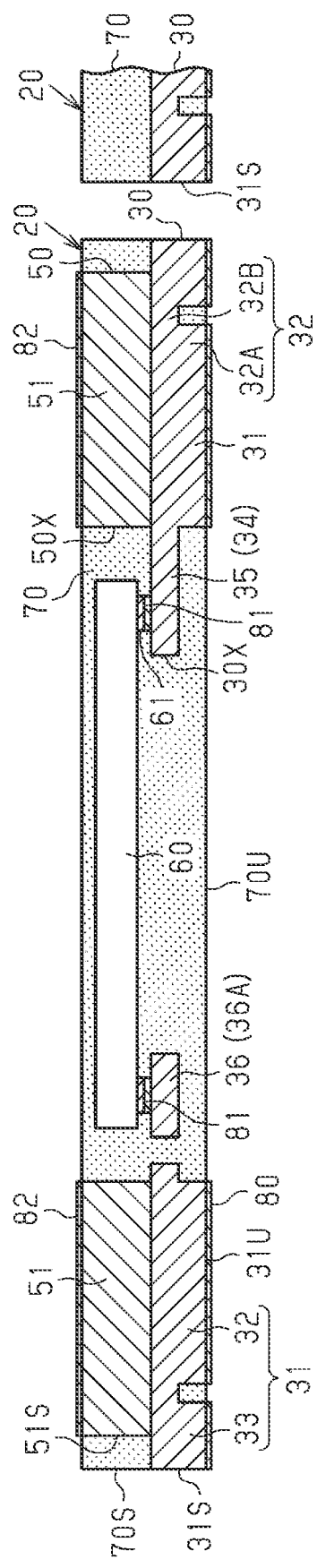
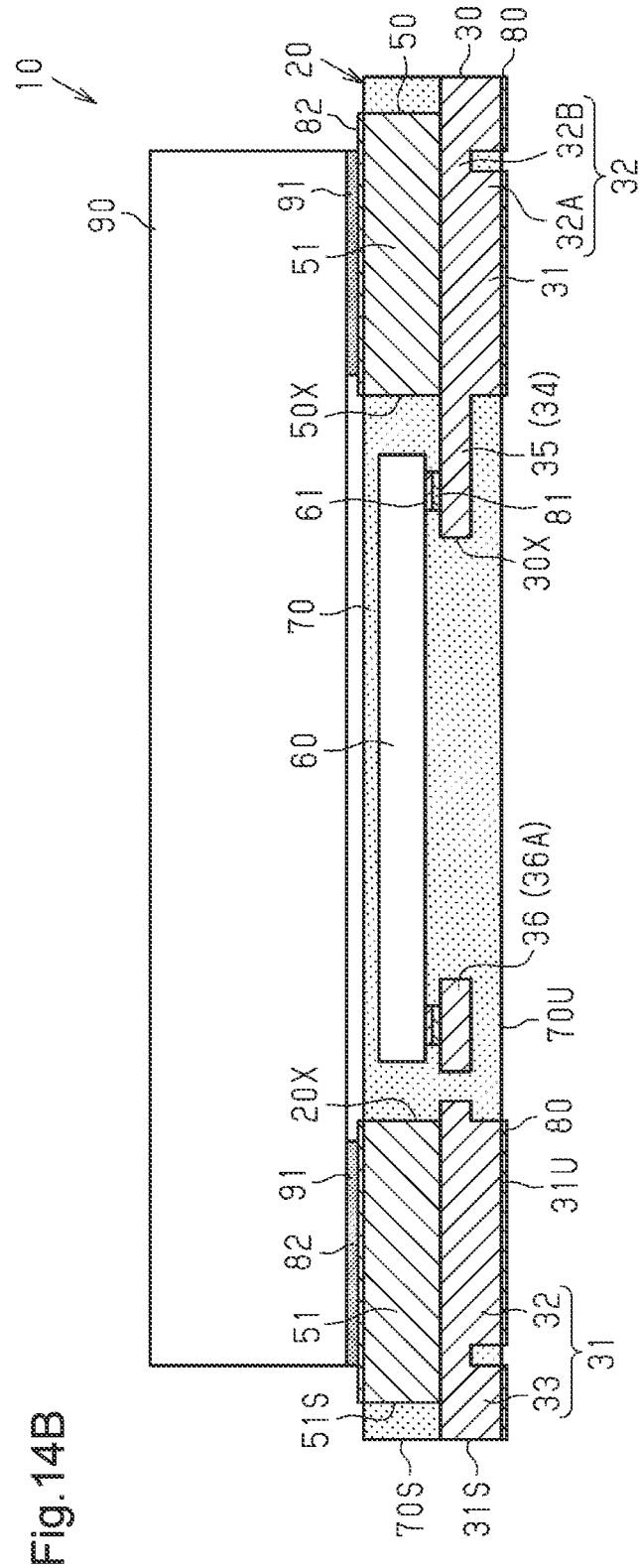
Fig.14A
Fig.14B

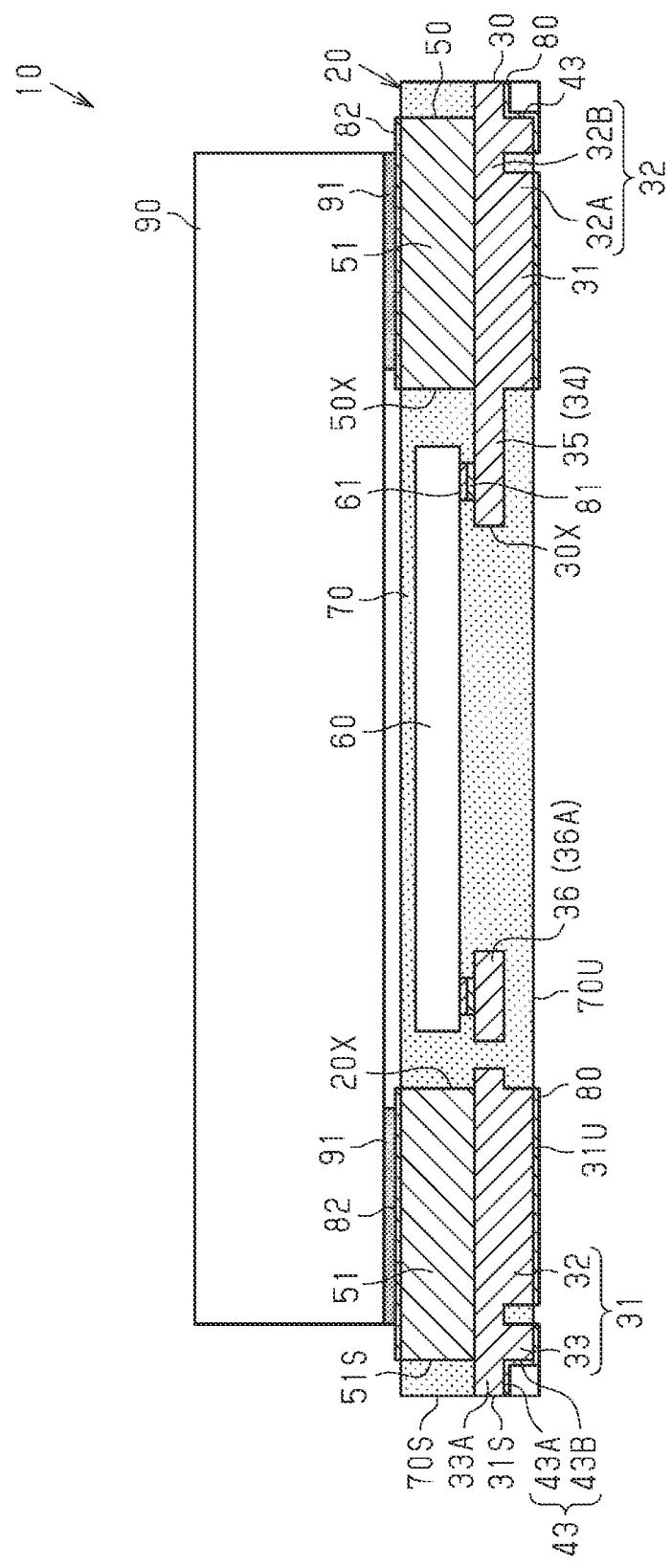

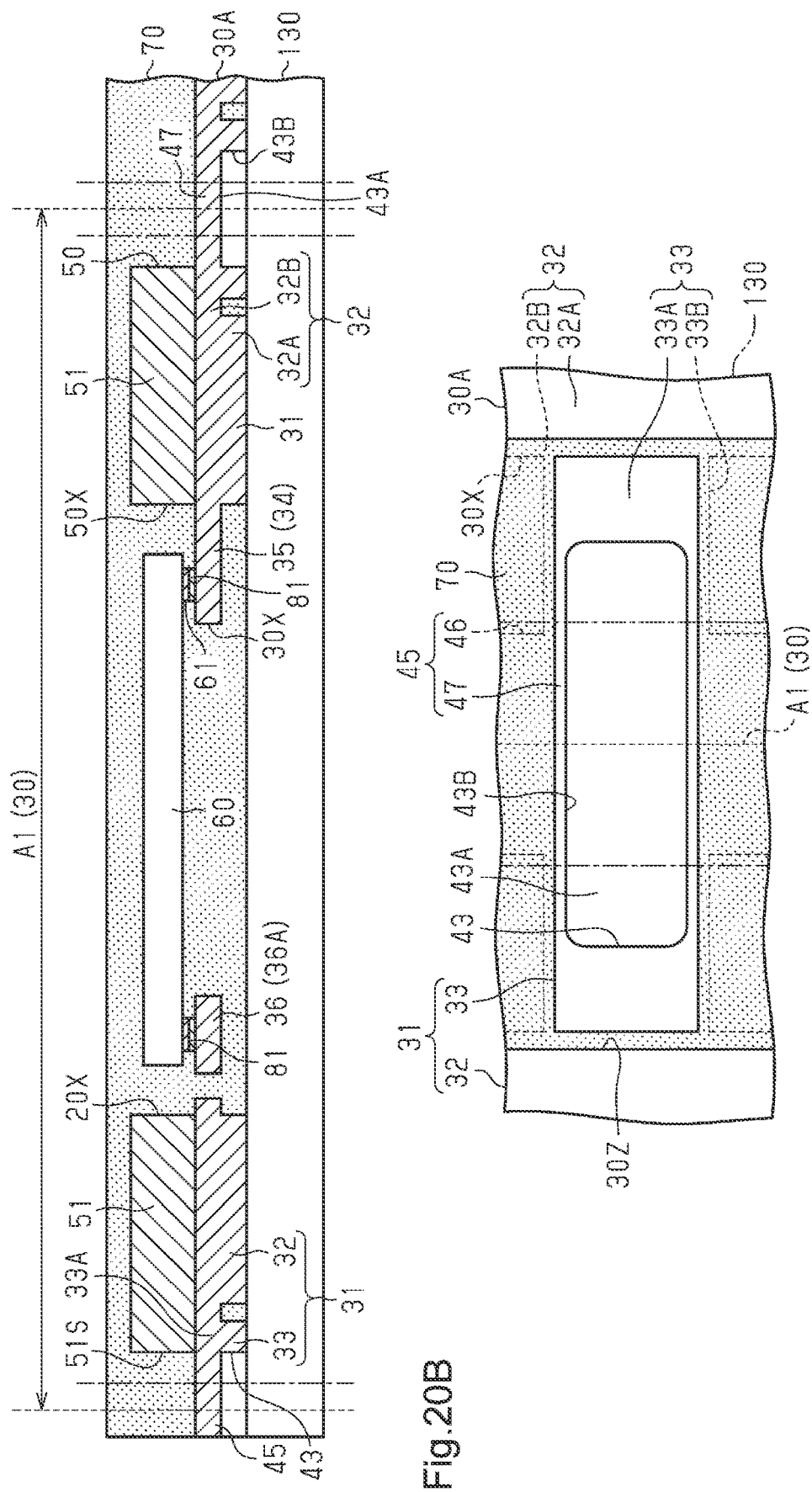

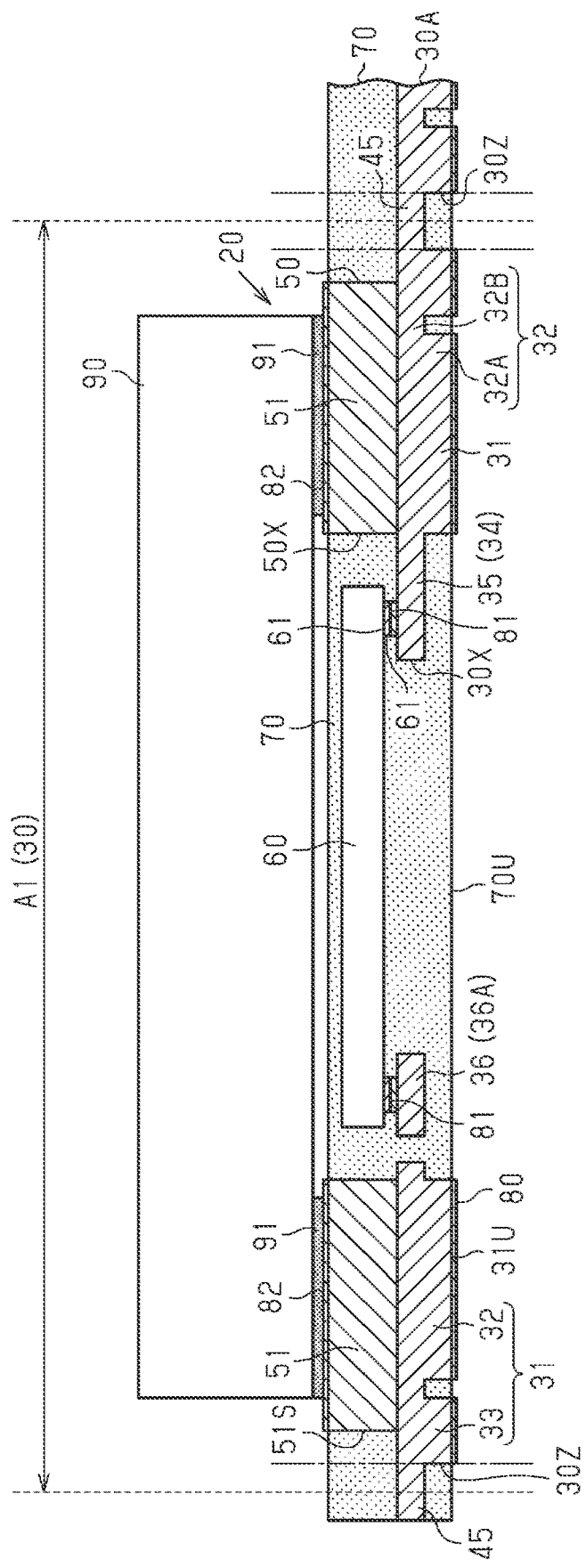

WIRING STRUCTURE HAVING STACKED FIRST AND SECOND ELECTRODES

CROSS-REFERENCE TO RELATED APPLICATIONS

This application is based upon and claims the benefit of priority from prior Japanese Patent Application No. 2020-076034, filed on Apr. 22, 2020, the entire contents of which are incorporated herein by reference.

FIELD

The present disclosure relates to a wiring substrate, an electronic device, and a method for manufacturing a wiring substrate.

BACKGROUND

Japanese Laid-Open Patent Publication No. 2012-191204 discloses a wiring substrate that incorporates an electronic component such as a semiconductor chip or a chip capacitor. The wiring substrate includes an interlayer insulation layer having an opening, and the electronic component is formed in the opening. Such a wiring substrate may be manufactured, for example, as follows.

First, a support substrate is prepared, and a wiring layer is formed on the support substrate. Then, a desired number of build-up wiring layers and interlayer insulation layers are stacked. Laser cutting is performed to form an opening in given ones of the interlayer insulation layers. After the electronic component is placed in the opening, an insulation layer fills the opening and entirely covers the electronic component. Then, a wiring layer is formed on the insulation layer and is electrically connected to the electronic component. Finally, the support substrate is removed.

SUMMARY

In a wiring substrate, electrical resistance may be increased in a portion that connects a via wiring and a build-up wiring layer. In this case, the reliability of electrical connection between the via wiring and the build-up wiring layer may be lowered.

An embodiment of a wiring substrate includes a first metal plate and a second electrode. The first metal plate includes a first electrode, a wiring, and a mount portion for an electronic component. The mount portion includes an upper surface of the wiring. The second electrode is joined to an upper surface of the first electrode. The first electrode is solid. The second electrode is solid.

BRIEF DESCRIPTION OF THE DRAWINGS

The embodiments, together with objects and advantages thereof, may best be understood by reference to the following description of the presently preferred embodiments together with the accompanying drawings in which:

FIGS. 7A, 7B, and 7C are schematic cross-sectional views illustrating manufacturing steps of the first metal plate illustrated in FIGS. 5 and 6;

FIG. 9 is a schematic plan view of a jig accommodating electrodes to illustrate a method for manufacturing the electronic device illustrated in FIG. 1;

FIGS. 10A, 10B, 11A, 11B, 12A, 12B, 13A, 13B, 14A, and 14B are schematic cross-sectional views illustrating a method for manufacturing the electronic device subsequent to the step illustrated in FIG. 9;

FIG. 15 is a schematic cross-sectional view illustrating an electronic device including a second embodiment of a wiring substrate taken along line 15-15 in FIG. 16;

FIG. 20A is a schematic cross-sectional view illustrating a method for manufacturing the wiring substrate subsequent to the step illustrated in FIG. 19A;

FIG. 20B is a schematic enlarged plan view illustrating a portion of FIG. 20A;

FIG. 23 is a schematic cross-sectional view illustrating a method for manufacturing a modified example of an electronic device.

DESCRIPTION OF THE EMBODIMENTS

Figure 1:
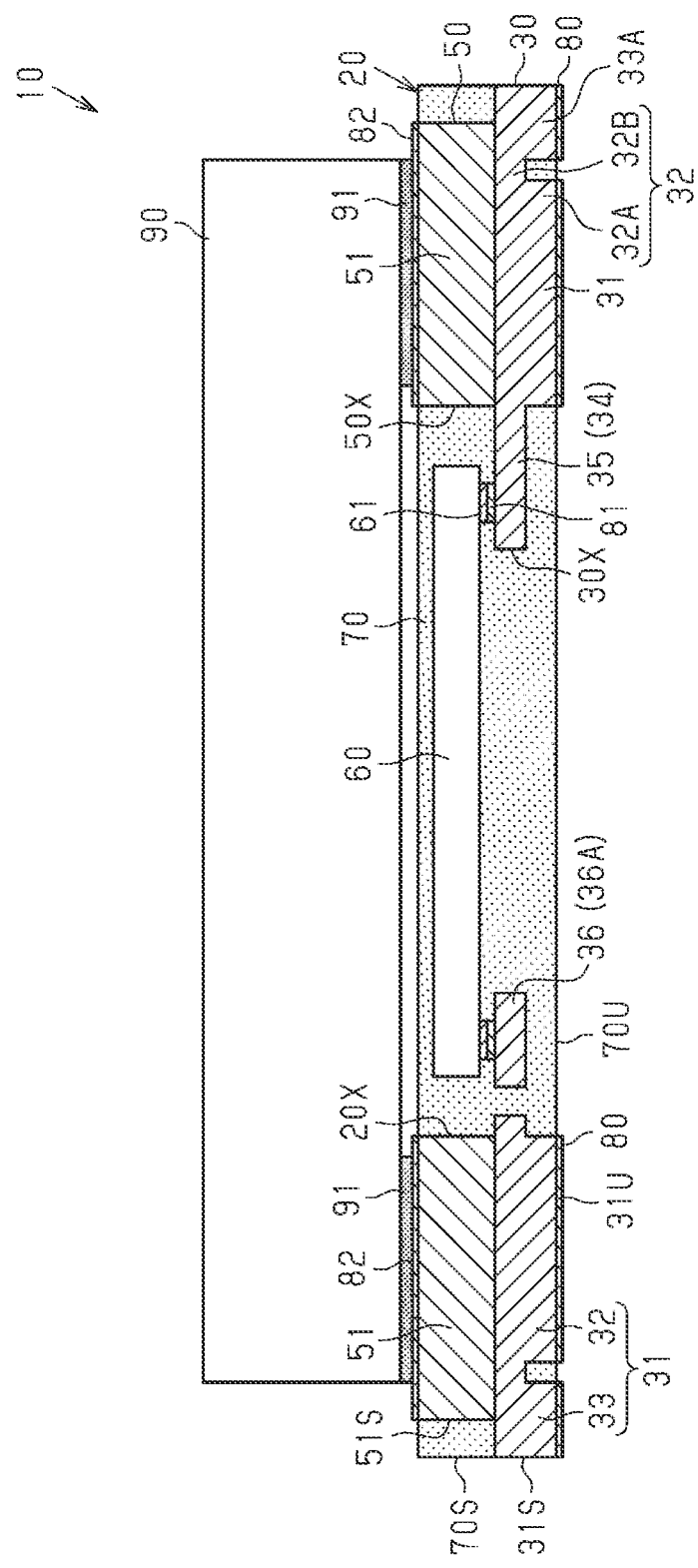
FIG. 1 is a schematic cross-sectional view illustrating an electronic device including a first embodiment of a wiring substrate taken along line 1-1 in FIGS. 2 and 3.

Embodiments will be described below with reference to the accompanying drawings.

Elements in the drawings may be partially enlarged for simplicity and clarity and thus have not necessarily been drawn to scale. To facilitate understanding, hatching lines may not be illustrated or be replaced by shadings in the cross-sectional drawings.

First Embodiment

A first embodiment will now be described with reference to FIGS. 1 to 14B.

Schematic Structure of Electronic Device 10

The structure of an electronic device 10 will now be described with reference to FIGS. 1 to 3.

As illustrated in FIG. 1, the electronic device 10 includes a wiring substrate 20 and one or more electronic components 90 mounted on the wiring substrate 20.

Figure 2:
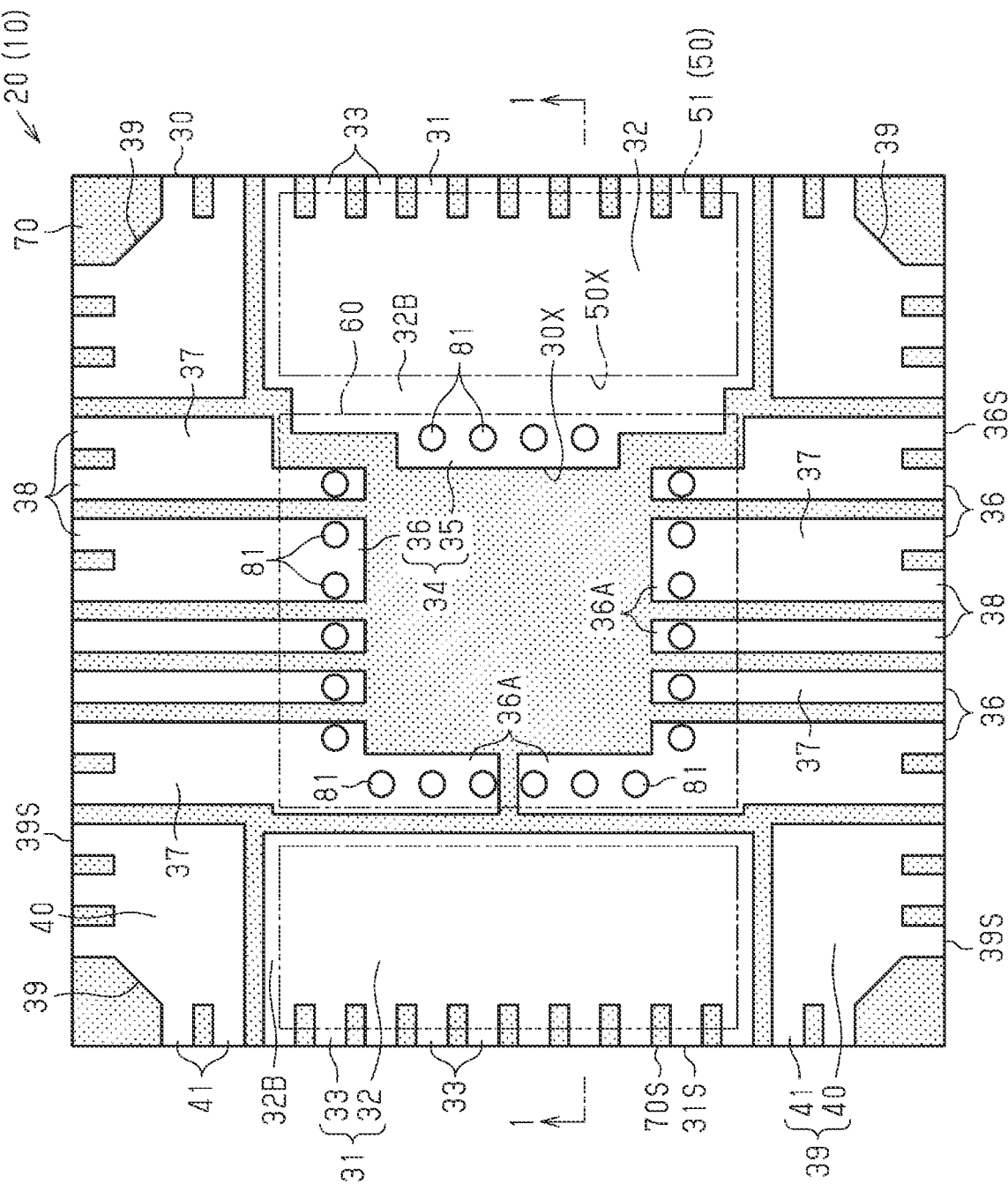
FIGS. 2 and 3 are schematic plan views of the wiring substrate illustrated in FIG. 1.

As illustrated in FIGS. 1 and 2, the wiring substrate 20 includes, for example, a metal plate 30 and a metal plate 50 joined to an upper surface of the metal plate 30. The wiring substrate 20 includes one or more (here, one) electronic components 60 mounted on the upper surface of the metal plate 30 and an insulation layer 70 formed in the space among the metal plate 30, the metal plate 50, and the electronic component 60. The insulation layer 70 covers the electronic component 60. That is, the wiring substrate 20 is a wiring substrate that incorporates the electronic component 60. FIG. 1 illustrates a cross-sectional structure of the electronic device 10 in the cross sections taken along line 1-1 in FIGS. 2 and 3.

Schematic Structure of Wiring Substrate 20

The wiring substrate 20 is, for example, rectangular-box-shaped. In the present example, the wiring substrate 20 has a rectangular planar shape. The dimensions of the wiring substrate 20 may be, for example, approximately 4 mm×4 mm to 10 mm×10 mm in plan view. The thickness of the wiring substrate 20 may be, for example, approximately 0.3 mm to 0.8 mm. In this specification, "plan view" refers to a view of a subject taken in a normal direction (vertical direction in FIG. 1) of the lower surface of the metal plate 30, and "planar shape" refers to a shape of a subject as viewed in the normal direction of the lower surface of the metal plate 30.

The material of the metal plates 30 and 50 may be, for example, copper (Cu) or a Cu alloy. The material of the metal plates 30 and 50 may be, for example, an iron-nickel (Fe—Ni) alloy such as Alloy 42. The metal plates 30 and 50 may be formed from the same material or different materials. The thickness of the metal plate 30 may be, for example, approximately 0.1 mm to 0.3 mm. The thickness of the metal plate 50 may be, for example, approximately 0.2 mm to 0.5 mm. The metal plates 30 and 50 may be set to have the same thickness or different thicknesses.

The material of the insulation layer 70 may be, for example, an insulative resin such as polyimide resin and epoxy resin or a resin material obtained by mixing the resin with a filler such as silica and alumina. The thickness of the insulation layer 70 from the lower surface to the upper surface of the insulation layer 70 may be, for example, approximately 0.3 mm to 0.8 mm.

Structure of Metal Plate 30

The structure of the metal plate 30 will now be described with reference to FIGS. 1 to 3.

Figure 3:
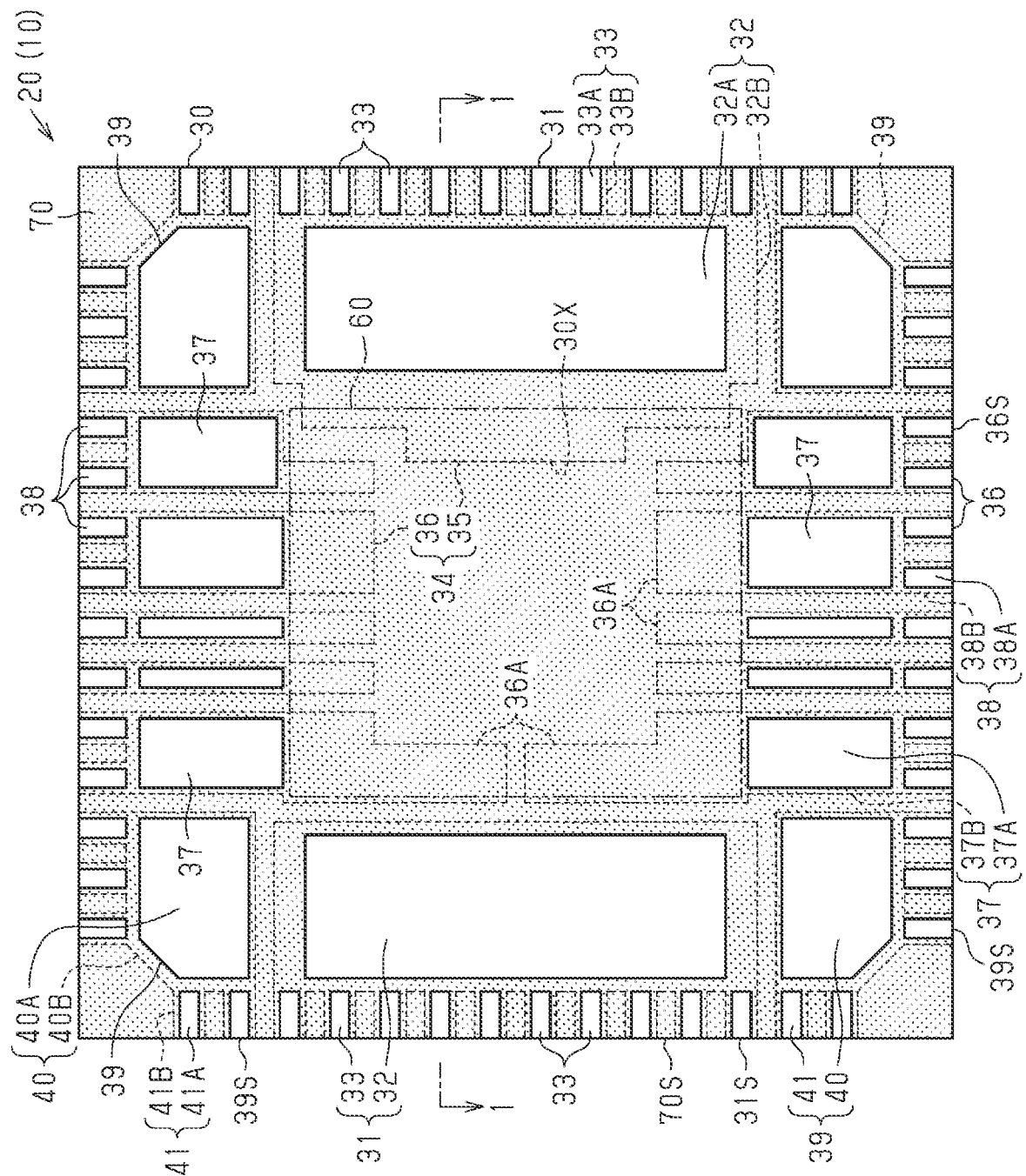

As illustrated in FIGS. 2 and 3, the metal plate 30 includes electrodes 31, wirings 34, and wirings 39. The electrodes 31, the wirings 34, and the wirings 39 are, for example, coplanar with each other. An opening 30X extends through the metal plate 30 in the thickness-wise direction of the metal plate 30 and defines the electrodes 31, the wirings 34, and the wirings 39. FIG. 2 is a plan view of the metal plate 30 and the insulation layer 70 taken from above. FIG. 3 is a plan view of the metal plate 30 and the insulation layer 70 taken from below. Each electrode 31 is an example of a first electrode.

Structure of Electrode 31

The electrodes 31 are spaced apart from each other. The electrodes 31 are, for example, formed in a peripheral region of the wiring substrate 20 (electronic device 10). The electrodes 31 are, for example, arranged along two facing sides of the four sides defining the contour of the wiring substrate 20. The electrodes 31 face each other in a direction (sideward direction in FIG. 2) in which the two facing sides are arranged.

As illustrated in FIG. 3, each electrode 31 includes, for example, a body 32 and projections 33. In the electrode 31, the body 32 and the projection 33 are formed, for example, continuously and integrally with each other.

The body 32 includes, for example, a base 32A and a thin portion 32B. The base 32A is, for example, rectangular-box-shaped. The base 32A is solid. The base 32A has, for example, a given width extending along a side of the contour of the wiring substrate 20 and solidly extends from a peripheral edge of the wiring substrate 20 toward an inner side of the wiring substrate 20. The widthwise dimension of the base 32A may be set to, for example, 0.3 to 0.7 times each side of the contour of the wiring substrate 20. In this specification, "widthwise dimension" of each member refers to a dimension extending in a peripheral direction of the wiring substrate 20 (electronic device 10), that is, a direction extending around outer side surfaces of the wiring substrate 20 (electronic device 10).

The thin portion 32B projects, for example, outward from a side surface of the base 32A. The thin portion 32B projects, for example, from a side surface of the base 32A toward the inner side of the wiring substrate 20. The thin portion 32B projects, for example, from a side surface of the base 32A in the peripheral direction of the wiring substrate 20. The thin portion 32B projects, for example, from a side surface of the base 32A toward a peripheral edge of the wiring substrate 20. In the present example, the thin portion 32B projects outward from the all side surfaces of the base 32A.

As illustrated in FIG. 1, the thin portion 32B is, for example, thinner than the base 32A. The thickness of the thin portion 32B may be set to, for example, approximately 0.3 to 0.7 times the thickness of the base 32A. The thin portion 32B is recessed from the lower surface of the base 32A toward the metal plate 50. That is, the upper surface of the thin portion 32B is substantially flush with the upper surface of the base 32A, and the lower surface of the thin portion 32B is located at a higher position than the lower surface of the base 32A. The lower surface of the thin portion 32B is covered by the insulation layer 70.

As illustrated in FIG. 3, the projections 33 are, for example, branched from a side surface of the body 32 that is located toward the peripheral edge of the wiring substrate 20. The projections 33 project, for example, from a side surface of the body 32 toward the peripheral edge of the wiring substrate 20 in a comb-teeth arrangement. The projections 33 are, for example, arranged at given intervals along the peripheral edge of the wiring substrate 20. In the present example, ten projections 33 are arranged at given intervals along a side of the contour of the wiring substrate 20. Each projection 33 projects toward a peripheral edge of the wiring substrate 20 from a side surface of the thin portion 32B that is located toward the peripheral edge of the wiring substrate 20. The widthwise dimension of the projection 33 is, for example, set to be less than the widthwise dimension of the body 32.

The projection 33 includes, for example, a base 33A and a thin portion 33B. The base 33A is, for example, rectangular-box-shaped. The thickness of the base 33A is, for example, the same as the thickness of the base 32A of the body 32.

The thin portion 33B projects, for example, outward from a side surface of the base 33A. The thin portion 33B projects, for example, from a side surface of the base 33A in the peripheral direction of the wiring substrate 20.

The thin portion 33B is, for example, thinner than the base 33A. The thickness of the thin portion 33B may be set to, for example, approximately 0.3 to 0.7 times the thickness of the base 33A. The thickness of the thin portion 33B is, for example, the same as the thickness of the thin portion 32B of the body 32. The lower surface of the thin portion 33B is covered by the insulation layer 70.

The electrode 31 has an outer side surface 31S, that is, an outer side surface 31S of each projection 33 located toward the peripheral edge of the wiring substrate 20. The outer side surface 31S is, for example, exposed from an outer side surface 70S of the insulation layer 70. The outer side surface 31S of the electrode 31 is, for example, substantially flush with the outer side surface 70S of the insulation layer 70.

As illustrated in FIG. 1, the electrode 31 includes a lower surface 31U, namely, a lower surface 31U of the bases 32A and 33A. The lower surface 31U is exposed from a lower surface 70U of the insulation layer 70. The lower surface 31U of the electrode 31 is, for example, substantially flush with the lower surface 70U of the insulation layer 70.

A metal layer 80 is formed on the lower surface 31U of the electrode 31, which is exposed from the insulation layer 70. The metal layer 80, for example, covers the entire lower surface 31U of the electrode 31. The metal layer 80 has a side surface that is, for example, substantially flush with the outer side surface 31S of the electrode 31 and the outer side surface 70S of the insulation layer 70. Examples of the metal layer 80 include a gold (Au) layer, a nickel (Ni) layer/Au layer (metal layer formed by stacking the Ni layer and the Au layer in this order), a Ni layer/palladium (Pd) layer/Au layer (metal layer formed by stacking the Ni layer, the Pd layer, and the Au layer in this order), and a Ni layer/silver (Ag) layer (metal layer formed by stacking the Ni layer and the Ag layer in this order). The Au layer is a metal layer formed of Au or an Au alloy. The Ni layer is a metal layer formed of Ni or a Ni alloy. The Pd layer is a metal layer formed of Pd or a Pd alloy. The Ag layer is a metal layer formed of Ag or an Ag alloy. Each of the Au layer, the Ni layer, the Pd layer, and the Ag layer may be, for example, a metal layer (electrolytic plated metal layer) formed through an electrolytic plating process. Instead of using the metal layer 80, for example, an anti-oxidation process such as an organic solderability preservative (OSP) process may be performed on the lower surface 31U of the electrode 31 to form an OSP film. The OSP film may be a coating of an organic compound such as an azole compound or an imidazole compound.

The lower surface 31U of the electrode 31 (in the example illustrated in FIG. 1, the lower surface 31U of the base 32A of the body 32 and the lower surface 31U of the base 33A of the projection 33) exposed from the lower surface 70U of the insulation layer 70 is used as a connection terminal (e.g., external connection terminal) of the electronic device 10. When the metal layer 80 is formed on the lower surface 31U of the electrode 31, the lower surface 31U including the metal layer 80 is used as a connection terminal (e.g., external connection terminal) of the electronic device 10.

Structure of Wiring 34

As illustrated in FIG. 2, the wirings 34 are arranged in a mount region of the electronic component 60. In the present example, the mount region of the electronic component 60 is located toward the inner side of the wiring substrate 20 from the electrodes 31. The wirings 34 include a wiring 35 that is formed integrally with the electrodes 31 and wirings 36 that are separate from the electrodes 31.

The wiring 35 is, for example, formed integrally with some of the electrodes 31. The wiring 35, for example, projects from some of the electrodes 31 toward the inner side of the wiring substrate 20. The wiring 35, for example, projects from the thin portion 32B of some of the electrodes 31 toward the inner side of the wiring substrate 20. The wiring 35, for example, has a given width extending along a side of the contour of the wiring substrate 20 and extends from the electrodes 31 toward the inner side of the wiring substrate 20. For example, the entire wiring 35 is arranged in the mount region of the electronic component 60. In the present example, the entire wiring 35 is used as a mount portion.

As illustrated in FIG. 1, the thickness of the wiring 35 is, for example, the same as the thickness of the thin portion 32B of the electrode 31. The wiring 35 is, for example, thinner than the base 32A of the electrode 31. The thickness of the wiring 35 may be set to, for example, approximately 0.3 to 0.7 times the thickness of the base 32A. The wiring 35 is recessed from the lower surface of the base 32A toward the metal plate 50. The lower surface of the wiring 35 is, for example, covered by the insulation layer 70.

As illustrated in FIG. 3, the wirings 36 are spaced apart from each other. The wirings 36 are, for example, formed in a peripheral region of the mount region of the electronic component 60. The wirings 36 are, for example, arranged at given intervals along a peripheral edge of the mount region of the electronic component 60. The wirings 36, for example, cooperate with the wiring 35 to surround the peripheral edge of the mount region of the electronic component 60.

Each wiring 36 includes, for example, a mount portion 36A arranged in the mount region of the electronic component 60, a connector 37 connected to the mount portion 36A, and a projection 38 connected to the connector 37. In the wiring 36, for example, the mount portion 36A, the connector 37, and the projection 38 are formed continuously and integrally with each other. The connector 37, for example, connects the mount portion 36A and the projection 38.

The connector 37 includes, for example, a base 37A and a thin portion 37B. The base 37A is, for example, rectangular-box-shaped. The base 37A has, for example, a band-shaped planar shape. The base 37A has, for example, a given width and extends from the peripheral edge toward the inner side of the wiring substrate 20. The widthwise dimension of the base 37A is, for example, set to be less than the widthwise dimension of the base 32A of the body 32. The thickness of the base 37A is, for example, the same as the thickness of the base 32A.

The thin portion 37B projects, for example, outward from a side surface of the base 37A. The thin portion 37B projects, for example, from a side surface of the base 37A toward the inner side of the wiring substrate 20. The thin portion 37B projects, for example, from a side surface of the base 37A in the peripheral direction of the wiring substrate 20. The thin portion 37B projects, for example, from a side surface of the base 37A toward a peripheral edge of the wiring substrate 20.

The thin portion 37B is, for example, thinner than the base 37A. The thickness of the thin portion 37B may be set to, for example, approximately 0.3 to 0.7 times the thickness of the base 37A. The thickness of the thin portion 37B is, for example, the same as the thickness of the thin portion 32B. The lower surface of the thin portion 37B is covered by the insulation layer 70.

The mount portion 36A, for example, projects from a side surface of the connector 37 toward the inner side of the wiring substrate 20. For example, the mount portion 36A projects toward the inner side of the wiring substrate 20 from a side surface of the thin portion 37B of the connector 37 that is located toward the inner side of the wiring substrate 20. The mount portion 36A has, for example, a band-shaped planar shape. The mount portion 36A has a given width and extends from the connector 37 toward the inner side of the wiring substrate 20.

The mount portion 36A is, for example, thinner than the base 37A of the connector 37. The thickness of the mount portion 36A may be set to, for example, approximately 0.3 to 0.7 times the thickness of the base 37A. The thickness of the mount portion 36A is, for example, the same as the thickness of the thin portion 37B of the connector 37. The mount portion 36A is recessed from the lower surface of the wiring 36 toward the upper surface of the wiring 36. The lower surface of the mount portion 36A is, for example, covered by the insulation layer 70.

The projection 38 projects, for example, from a side surface of the connector 37 toward the peripheral edge of the wiring substrate 20. The projection 38 projects, for example, toward the peripheral edge of the wiring substrate 20 from a side surface of the thin portion 37B of the connector 37 that is located toward the peripheral edge of the wiring substrate 20. In the wiring 36, for example, one or more projections 38 are formed for one connector 37. When two or more projections 38 are formed for one connector 37, the projections 38 project from a side surface of the connector 37 toward the peripheral edge of the wiring substrate 20 in a comb-teeth arrangement. The projections 38 are, for example, arranged at given intervals along the peripheral edge of the wiring substrate 20. The widthwise dimension of the projection 38 is, for example, set to be the same as the widthwise dimension of the projection 33.

Each projection 38 includes, for example, a base 38A and a thin portion 38B. The base 38A is, for example, rectangular-box-shaped. The thickness of the base 38A is, for example, the same as the thickness of the base 37A of the connector 37.

The thin portion 38B projects, for example, outward from a side surface of the base 38A. The thin portion 38B projects, for example, from a side surface of the base 38A in the peripheral direction of the wiring substrate 20.

The thin portion 38B is, for example, thinner than the base 38A. The thickness of the thin portion 38B may be set to, for example, approximately 0.3 to 0.7 times the thickness of the base 38A. The thickness of the thin portion 38B is, for example, the same as the thickness of the thin portion 37B. The lower surface of the thin portion 38B is covered by the insulation layer 70.

The wiring 36 has an outer side surface 36S, that is, an outer side surface 36S of each projection 38 located toward the peripheral edge of the wiring substrate 20. The outer side surface 36S is, for example, exposed from the outer side surface 70S of the insulation layer 70. The outer side surface 36S of the wiring 36 is, for example, substantially flush with the outer side surface 70S of the insulation layer 70.

The lower surface of the wiring 36 is exposed from the insulation layer 70. In the present example, the lower surface of the wiring 36 corresponds to the lower surface of the base 37A of the connector 37 and the lower surface of the base 38A of the projection 38. The lower surface of the wiring 36 is, for example, substantially flush with the lower surface 70U of the insulation layer 70 (refer to FIG. 1). The metal layer 80 (refer to FIG. 1) is, for example, formed on the lower surface of the wiring 36. The lower surface of the wiring 36 (in the present example, the lower surface of the base 37A of the connector 37 and the lower surface of the base 38A of the projection 38) exposed from the lower surface 70U of the insulation layer 70 is used as a connection terminal (e.g., external connection terminal) of the electronic device 10. When the metal layer 80 is formed on the lower surface of the wiring 36, the lower surface of the wiring 36 including the metal layer 80 is used as a connection terminal (e.g., external connection terminal) of the electronic device 10.

The wirings 35 and 36 illustrated in FIG. 2 are, for example, wirings used for mounting the electronic component 60. Metal layers 81 are formed on the upper surface of the wiring 35 and the upper surface of the mount portion 36A of each wiring 36. The metal layers 81 are, for example, formed along peripheral edges of the electronic component 60. Each metal layer 81 is, for example, partially formed on the upper surface of the wiring 35 or the upper surface of the mount portion 36A. The metal layer 81 is, for example, circular in plan view. As illustrated in FIG. 1, each metal layer 81 conforms to a bump 61 of the electronic component 60. That is, the metal layer 81 is located at a position facing the bump 61 of the electronic component 60 when the electronic component 60 is mounted on the metal plate 30. The metal layer 81 may be an Au layer, a Ni layer/Au layer, a Ni layer/Pd layer/Au layer, or a Ni layer/Ag layer. The upper surface of the wiring 35 and the upper surface of the mount portion 36A of each wiring 36 are used as a mount portion for the electronic component 60. When the metal layers 81 are formed on the upper surface of the wiring 35 and the upper surface of the mount portion 36A of each wiring 36, the metal layers 81 are included in the mount portion for the electronic component 60.

Structure of Wiring 39

As illustrated in FIGS. 2 and 3, the wirings 39 are, for example, formed in corners of the wiring substrate 20. The wirings 39 are, for example, formed in four corners (four angles) of the wiring substrate 20. Each wiring 39 is, for example, spaced apart from the electrodes 31 and the wirings 35 and 36.

Each the wiring 39 includes, for example, a body 40 and a projection 41. In the wiring 39, for example, the body 40 is formed continuously with the projection 41.

As illustrated in FIG. 3, the body 40 includes, for example, a base 40A and a thin portion 40B. The base 40A has, for example, a polygonal planar shape. The thickness of the base 40A is, for example, the same as the thickness of the base 32A.

The thin portion 40B projects, for example, outward from a side surface of the base 40A. The thin portion 40B projects, for example, from a side surface of the base 40A toward the inner side of the wiring substrate 20. The thin portion 40B projects, for example, from a side surface of the base 40A in the peripheral direction of the wiring substrate 20. The thin portion 40B projects, for example, from a side surface of the base 40A toward a peripheral edge of the wiring substrate 20. In the present example, the thin portion 40B projects from the all side surfaces of the base 40A.

The thin portion 40B is, for example, thinner than the base 40A. The thickness of the thin portion 40B may be set to, for example, approximately 0.3 to 0.7 times the thickness of the base 40A. The thickness of the thin portion 40B is, for example, the same as the thickness of the thin portion 32B.

The thin portion 40B is recessed from the lower surface of the base 40A toward the upper surface of the base 40A. The lower surface of the thin portion 40B is, for example, covered by the insulation layer 70.

The projections 41 are, for example, branched from a side surface of the body 40 that is located toward the peripheral edge of the wiring substrate 20. The projections 41 project from a side surface of the body 40 toward the peripheral edge of the wiring substrate 20 in a comb-teeth arrangement. Each projection 41 projects toward a peripheral edge of the wiring substrate 20 from a side surface of the thin portion 40B of the body 40 that is located toward the peripheral edge of the wiring substrate 20. The projections 41 are, for example, arranged at given intervals along the peripheral edge of the wiring substrate 20. The widthwise dimension of each projection 41 is, for example, set to be the same as the widthwise dimension of the projections 33 and 38.

The projection 41 includes, for example, a base 41A and a thin portion 41B. The base 41A is, for example, rectangular-box-shaped. The thickness of the base 41A is, for example, the same as the thickness of the base 40A of the body 40.

The thin portion 41B projects, for example, outward from a side surface of the base 41A. The thin portion 41B projects, for example, from a side surface of the base 41A in the peripheral direction of the wiring substrate 20.

The thin portion 41B is, for example, thinner than the base 41A. The thickness of the thin portion 41B may be set to, for example, approximately 0.3 to 0.7 times the thickness of the base 41A. The thickness of the thin portion 41B is, for example, the same as the thickness of the thin portion 40B. The lower surface of the thin portion 41B is covered by the insulation layer 70.

The wiring 39 has an outer side surface 39S, that is, an outer side surface 39S of each projection 41 located toward the peripheral edge of the wiring substrate 20. The outer side surface 39S is, for example, exposed from the outer side surface 70S of the insulation layer 70. The outer side surface 39S of the wiring 39 is, for example, substantially flush with the outer side surface 70S of the insulation layer 70.

The lower surface of the wiring 39 is exposed from the insulation layer 70. In the present example, the lower surface of the wiring 39 corresponds to the lower surface of the base 40A of the body 40 and the lower surface of the base 41A of the projection 41. The lower surface of the wiring 39 is, for example, substantially flush with the lower surface 70U of the insulation layer 70 (refer to FIG. 1). The metal layer 80 (refer to FIG. 1) is, for example, formed on the lower surface of the wiring 39. The lower surface of the wiring 39 (in the present example, the lower surface of the base 40A of the body 40 and the lower surface of the base 41A of the projection 41) exposed from the lower surface 70U of the insulation layer 70 is used as a connection terminal (e.g., external connection terminal) of the electronic device 10. When the metal layer 80 is formed on the lower surface of the wiring 39, the lower surface of the wiring 39 including the metal layer 80 is used as a connection terminal (e.g., external connection terminal) of the electronic device 10.

The projection 33 of the electrode 31, the projection 38 of the wiring 36, and the projection 41 of the wiring 39 are, for example, identical in planar shape and the same in size. Also, the base 33A of the projection 33, the base 38A of the projection 38, and the base 41A of the projection 41 are, for example, identical in planar shape and the same in size.

Structure of Metal Plate 50

The structure of the metal plate 50 will now be described. As illustrated in FIG. 1, the lower surface of the metal plate 50 is joined to the upper surface of the metal plate 30. In the present example, the lower surface of the metal plate 50 is joined to the upper surface of the metal plate 30 by diffusion bonding. Thus, the metal plate 50 is electrically connected to the metal plate 30. Diffusion bonding is a technique that applies heat and pressure to metal materials arranged in close contact with each other in a vacuum or inert gas environment so that the metal materials are joined to each other at an atomic level by diffusion of atoms that occurs in the joined surfaces of the metal materials. The metal plate 30 and the metal plate 50 that are joined by diffusion bonding are integrated without a boundary surface (i.e., with no space), and the upper surface of the metal plate 30 is directly joined to the lower surface of the metal plate 50. In the drawings, the metal plate 30 and the metal plate 50 are separated by solid lines to facilitate recognition of the metal plate 30 and the metal plate 50. However, actual boundary surfaces of the metal plate 30 and the metal plate 50 may have disappeared and may be unclear.

The metal plate 50 includes an opening 50X that exposes the mount region of the electronic component 60. The opening 50X exposes, for example, the metal plate 30 located in the mount region of the electronic component 60, namely, the wiring 35 and the mount portions 36A of the wirings 36. The opening 50X is large enough to accommodate the electronic component 60.

The metal plate 50 includes, for example, electrodes 51. The electrodes 51 are, for example, coplanar with each other. The opening 50X is arranged, for example, between the electrodes 51. Each electrode 51 is an example of a second electrode.

Structure of Electrode 51

As illustrated in FIG. 2, the electrodes 51 are spaced apart from each other. The electrodes 51 are arranged in the peripheral region of the wiring substrate 20. The electrodes 51 are, for example, arranged along two facing sides of the four sides defining the contour of the wiring substrate 20. The electrodes 51 face each other in a direction (sideward direction in FIG. 2) in which the two facing sides are arranged.

Each electrode 51 is, for example, rectangular box-shaped. The electrode 51 is solid. The electrode 51 has, for example, a given width extending along a side of the contour of the wiring substrate 20 and solidly extends from a peripheral edge of the wiring substrate 20 toward the inner side of the wiring substrate 20. The widthwise dimension of the electrode 51 may be set to, for example, 0.3 to 0.7 times each side of the contour of the wiring substrate 20.

The electrode 51 is arranged at a position overlapping the electrode 31 in plan view. In the present example, the lower surface of the electrode 51 is joined to the upper surface of the electrode 31 by diffusion bonding. Most of the electrode 51 overlaps the body 32 of the electrode 31 in plan view. In addition, the electrode 51, for example, partially overlaps the projections 33 of the electrode 31. In plan view, the electrode 51 is, for example, slightly smaller than the electrode 31. The electrode 51 exposes the metal plate 30 located in the mount region of the electronic component 60 (i.e., wiring 35 and mount portion 36A of wiring 36). The side surface of the electrode 51 that is located toward the inner side of the wiring substrate 20 defines a wall surface of the opening 50X in the metal plate 50.

As illustrated in FIG. 1, the electrode 51 is, for example, thicker than the electronic component 60. The thickness of the electrode 51 is, for example, greater than the sum of the thickness of the electronic component 60 including a bump 61 and the thickness of the metal layer 81. In the present example, the thickness of the electrode 51 is uniform in the entire surface.

The electrode 51 has an outer side surface 51S, that is, a side surface of the electrode 51 that is located toward the peripheral edge of the wiring substrate 20. The outer side surface 51S is, for example, located at a position recessed from the outer side surface 70S of the insulation layer 70 toward the inner side of the wiring substrate 20. The outer side surface 51S of the electrode 51 is, for example, covered by the insulation layer 70. The insulation layer 70, for example, covers the entire outer side surface 51S of the electrode 51. The insulation layer 70, for example, covers the entirety of side surfaces of the electrode 51.

The upper surface of the electrode 51 is exposed from the insulation layer 70. The upper surface of the electrode 51 is, for example, substantially flush with the upper surface of the insulation layer 70. The upper surface of the electrode 51 exposed from the insulation layer 70 is used as an electrode pad connected to an electronic component 90. A metal layer 82 is formed on the upper surface of the electrode 51 exposed from the insulation layer 70. The metal layer 82, for example, covers the entire upper surface of the electrode 51. The metal layer 82 may be, for example, an Au layer, a Ni layer/Au layer, a Ni layer/Pd layer/Au layer, or a Ni layer/Ag layer. Instead of using the metal layer 82, for example, an anti-oxidation process such as an OSP process may be performed on the upper surface of the electrode 51 to form an OSP film.

Structure of Metal Plates 30 and 50

In the wiring substrate 20 of the present example, the metal plate 50 is joined to the upper surface of the metal plate 30 by diffusion bonding. The opening 50X formed in the metal plate 50 exposes the metal plate 30 (e.g., wiring 35 and mount portion 36A of wirings 36) located in the mount region of the electronic component 60. In the wiring substrate 20, the opening 50X and the metal plate 30 exposed in the opening 50X define a cavity 20X that accommodates the electronic component 60. That is, the bottom surface of the cavity 20X is formed by the wiring 35 and the mount portion 36A of the wiring 36. The side surfaces of the cavity 20X are formed by wall surfaces of the opening 50X.

Structure of Electronic Component 60

The electronic component 60 is accommodated in the cavity 20X. The electronic component 60 is mounted on the upper surface of the metal plate 30. For example, the electronic component 60 is mounted on the upper surface of the wiring 35 and the upper surfaces of the mount portions 36A of the wirings 36.

The electronic component 60 may be, for example, an active component such as a semiconductor chip, a transistor, or a diode, or a passive component such as a chip capacitor, a chip inductor, or a chip resistor. The electronic component 60 may be, for example, a silicon component or a ceramic component. In the present embodiment, the electronic component 60 is a semiconductor chip. The semiconductor chip may be, for example, a logic chip such as a central processing unit (CPU) chip or a graphics processing unit (GPU) chip. The semiconductor chip may be, for example, a memory chip such as a dynamic random access memory (DRAM) chip, a static random access memory (SRAM) chip, or a flash memory chip.

In the present example, the electronic component 60 is flip-chip mounted on the wirings 34. For example, the bumps 61 arranged on terminals (not illustrated) formed on a circuit formation surface (here, under surface) of the electronic component 60 and are joined to the metal layers 81 formed on the upper surface of the wirings 35 and 36.

Thus, the terminals of the electronic component 60 are electrically connected to the wirings 35 and 36 by the bumps 61 and the metal layers 81.

Structure of Insulation Layer 70

The insulation layer 70 fills the space between the metal plate 30 and the metal plate 50 and the space among the electronic component 60 and the metal plates 30 and 50. The insulation layer 70 fills, for example, the openings 30X and 50X formed in the metal plates 30 and 50, respectively. For example, the insulation layer 70 fills the space between the electrodes 31, the space between the wirings 34, the space between the wirings 39 (refer to FIG. 2), the space among the electrodes 31, the wirings 34, and the wirings 39, and the space between the electrodes 51. The insulation layer 70 covers the entire upper surface of the metal plate 30 exposed from the metal plate 50. The insulation layer 70 covers, for example, the entirety of the electronic component 60. The insulation layer 70 covers, for example, the entirety of side surfaces of the electrode 51.

Structure of Electronic Component 90

One or more (here, one) electronic components 90 are mounted on the upper surface of the metal plate 50. The electronic component 90 is, for example, mounted on the upper surfaces of the electrodes 51. The electronic component 90 may be, for example, a passive component such as a chip capacitor, a chip inductor, or a chip resistor or an active component such as semiconductor chip, a transistor, or a diode. The electronic component 90 may be, for example, a silicon component or a ceramic component. In the present embodiment, the electronic component 90 is a chip inductor.

The electronic component 90, for example, extends over the opening 50X formed between the electrodes 51 and is mounted on the upper surfaces of the two electrodes 51 located at opposite sides of the opening 50X. The electronic component 90 is mounted on, for example, the metal layer 82 formed on the upper surface of the electrodes 51. The electronic component 90 is, for example, joined to the metal layer 82 by a conductive joint material 91. For example, the electronic component 90 has terminals (not illustrated) joined to the metal layer 82 by the joint material 91. Thus, the terminals of the electronic component 90 are electrically connected to the electrodes 51 by the joint material 91 and the metal layer 82. The terminals of the electronic component 90 are, for example, electrically connected to the electronic component 60 by the electrodes 51 and 31, the wiring 35, and the metal layer 81. The electronic component 90 overlaps, for example, part of the electronic component 60 in plan view.

The joint material 91 may be, for example, solder, a conductive paste such as a silver paste, or a brazing metal. Solder may be, for example, a lead-free solder. Examples of lead-free solder include a Sn—Ag base, a Sn—Cu base, a Sn—Ag—Cu base, or a Sn—Zn—Bi base solder.

Applicable Example of Electronic Device 10

Figure 4:
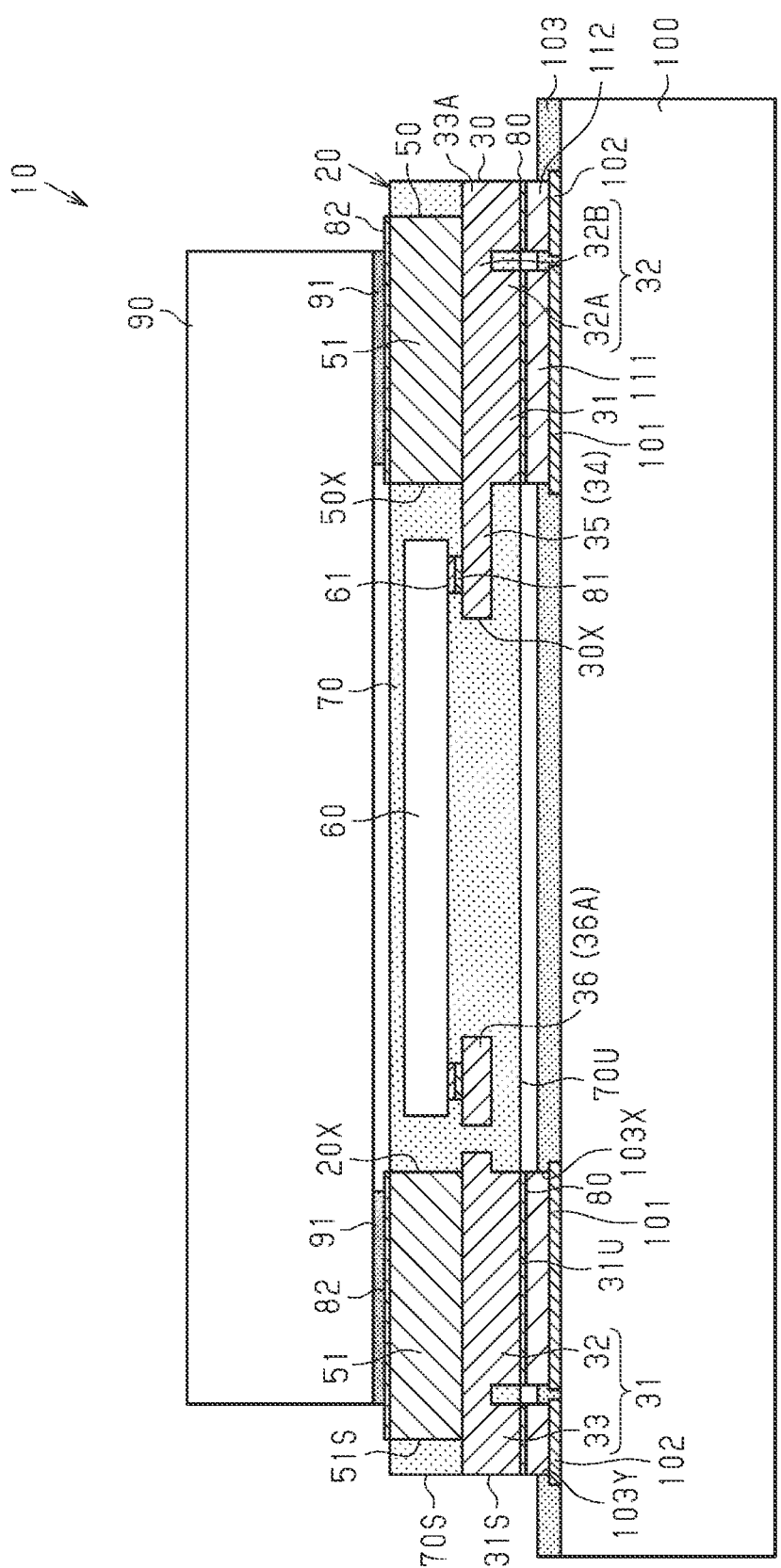
FIG. 4 is a schematic cross-sectional view of an applicable example of the electronic device illustrated in FIG. 1.

An example of a mode for mounting the electronic device 10 will now be described with reference to FIG. 4.

The electronic device 10 is, for example, mounted on a wiring substrate 100 such as a motherboard for mounting. Wiring layers 101, wiring layers 102, and a solder resist layer 103 that covers the wiring layers 101 and 102 are stacked on the upper surface of the wiring substrate 100. The wiring layers 101 are arranged, for example, in correspondence with the body 32 of the electrode 31, the connector 37 of the wiring 36 (refer to FIG. 3), and the body 40 of the wiring 39 (refer to FIG. 3). The wiring layers 102 are, for example, spaced apart from the wiring layers 101. The wiring layers 102 are arranged, for example, in correspondence with the projection 33 of the electrode 31, the projection 38 of the wiring 36 (refer to FIG. 3), and the projection 41 of the wiring 39 (refer to FIG. 3).

The solder resist layer 103 includes, for example, openings 103X that partially expose the upper surface of the wiring layers 101 and openings 103Y that partially expose the upper surface of the wiring layers 102. The planar shape of each opening 103X conforms to, for example, the base 32A of the body 32 of the electrode 31, the base 37A of the connector 37 of the wiring 36 (refer to FIG. 3), and the base 40A of the body 40 of the wirings 39 (refer to FIG. 3). The openings 103X and the bases 32A, 37A, and 40A are, for example, identical in planar shape and the same in size. For example, the openings 103X may be greater in plan view than the bases 32A, 37A, and 40A and be mathematically similar in planar shape to the bases 32A, 37A, and 40A. The planar shape of each opening 103Y conforms to, for example, the base 33A of the projection 33 of the electrode 31, the base 38A of the projection 38 of the wiring 36 (refer to FIG. 3), and the base 41A of the projection 41 of the wiring 39 (refer to FIG. 3). The openings 103Y and the bases 33A, 38A, and 41A are, for example, identical in planar shape and the same in size. For example, the openings 103Y may be greater in plan view than the bases 33A, 38A, and 41A and be mathematically similar in planar shape to the bases 33A, 38A, and 41A. For example, all of the openings 103Y are identical in planar shape and the same in size.

In the electronic device 10, the base 32A of the body 32 of the electrode 31 is joined to the wiring layer 101 by a solder layer 111. For example, the metal layer 80, which is formed on the lower surface 31U of the base 32A, is joined to the wiring layer 101 by the solder layer 111. In the same manner, the base 37A of the connector 37 of the wiring 36 (refer to FIG. 3) is joined to the wiring layer 101 by the solder layer 111, and the base 40A of the body 40 of the wiring 39 (refer to FIG. 3) is joined to the wiring layer 101 by the solder layer 111. In addition, in the electronic device 10, the base 33A of the projection 33 of the electrode 31 is joined to the wiring layer 102 by a solder layer 112. For example, the metal layer 80, which is formed on the lower surface 31U of the base 33A, is joined to the wiring layer 102 by the solder layer 112. In the same manner, the base 38A of the projection 38 of the wiring 36 (refer to FIG. 3) is joined to the wiring layer 102 by the solder layer 112, and the base 41A of the projection 41 of the wiring 39 (refer to FIG. 3) is joined to the wiring layer 102 by the solder layer 112.

The material of the wiring layers 101 and 102 may be, for example, copper or a copper alloy. The material of the solder resist layer 103 may be, for example, a photosensitive insulative resin including a phenol resin or a polyimide resin as a main component. The solder resist layer 103 may include, for example, a filler such as silica or alumina. The material of the solder layers 111 and 112 may be, for example, a lead-free solder. Examples of lead-free solder include a Sn—Ag base, a Sn—Cu base, a Sn—Ag—Cu base, or a Sn—Zn—Bi base solder.

Manufacturing Method of Electronic Device 10

A method for manufacturing the electronic device 10 will now be described. To facilitate understanding, portions that ultimately become elements of the electronic device 10 are indicated by reference characters used to denote the final elements.

Figure 5:
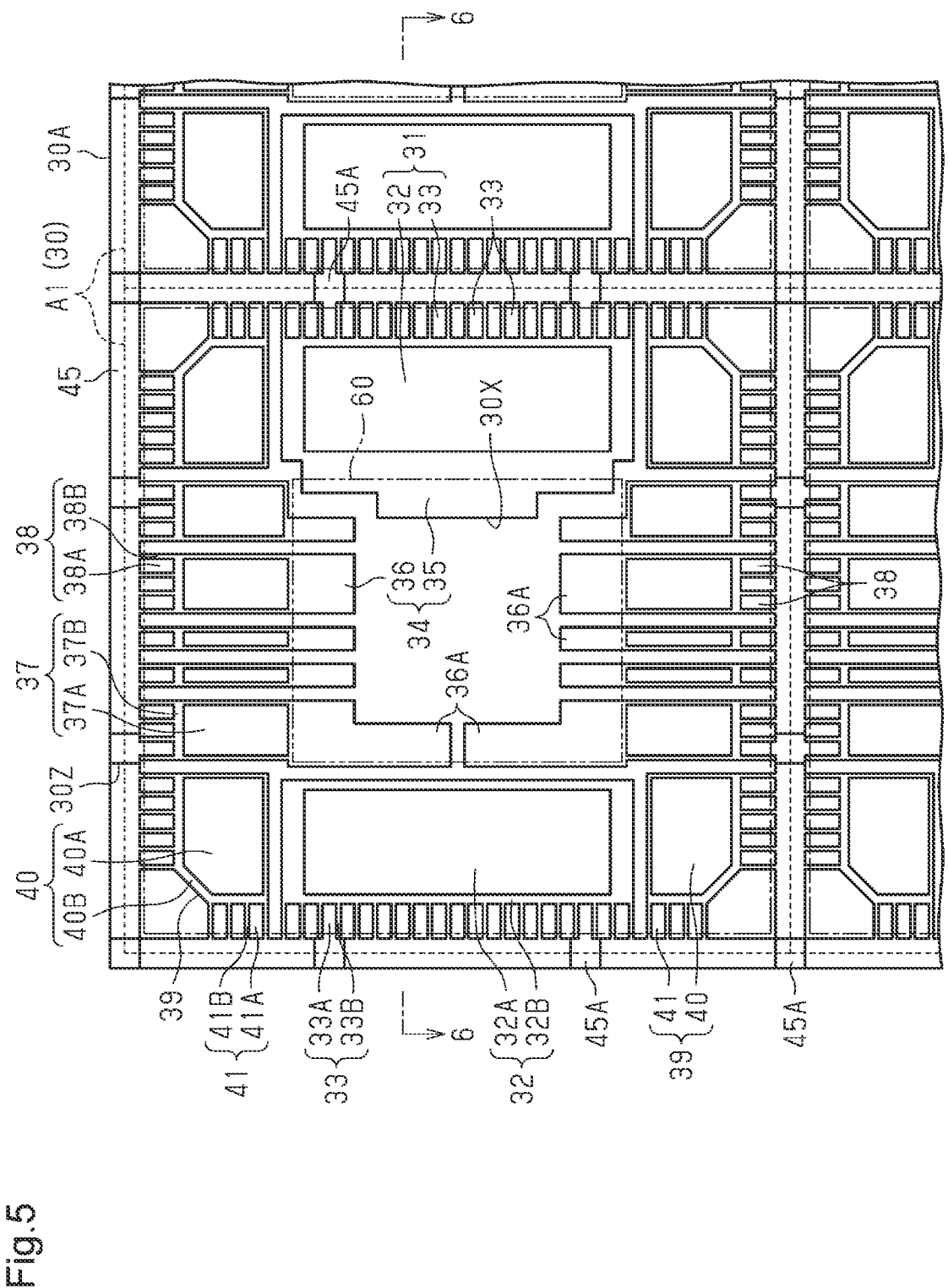
FIG. 5 is a schematic plan view of a first metal plate illustrating a method for manufacturing the electronic device illustrated in FIG. 1.

In the step illustrated in FIG. 5, a large metal plate 30A is prepared. The metal plate 30A includes, for example, multiple separate regions A1 arranged in a matrix where the metal plates 30 are formed. The number of separate regions A1 in the metal plate 30A is not particularly limited. For the sake of simplicity, the following description will focus on one separate region A1.

As illustrated in FIG. 5, each separate region A1 of the metal plate 30A includes frame portions 45 that are grid-shaped in plan view and an opening 30X that extends from the frame portions 45 toward a center of the separate region A1 in plan view and defines the electrodes 31 and the wirings 34 and 39. At this time, the electrodes 31 and the wirings 34 and 39 formed in each separate region A1 are joined by the frame portions 45 to the electrodes 31 and the wirings 34 and 39 formed in adjacent separate regions A1. Each electrode 31 includes the body 32 and the projection 33. The wirings 34 include the wiring 35 and the wirings 36. Each wiring 36 includes the mount portion 36A, the connector 37, and the projection 38. Each wiring 39 includes the body 40 and the projection 41. After the structural body corresponding to the electronic device 10 illustrated in FIG. 1 is formed, the separate regions A1 are ultimately cut along cutting lines indicated by single-dashed lines and singulated into separate electronic devices 10. Portions of the separate region A1 located outside the region surrounded by the single-dashed lines, that is, the frame portions 45, are discarded ultimately. FIG. 5 is a plan view of the structural body illustrated in FIG. 6 taken from below.

Figure 6:
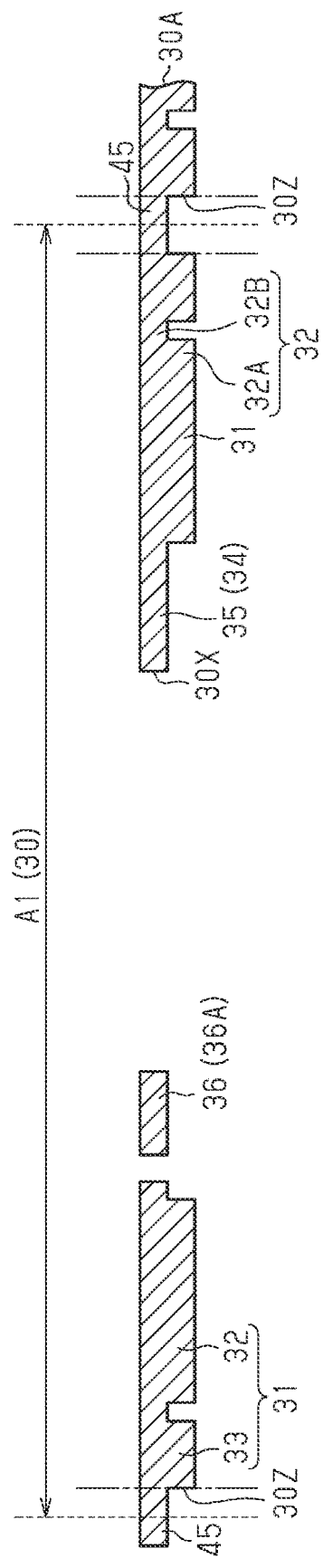
FIG. 6 is a schematic cross-sectional view of the first metal plate in a separate region taken along line 6-6 in FIG. 5.

In the present example, as illustrated in FIG. 6, recesses 30Z are formed in the lower surface of the frame portion 45, a portion of the lower surface of the electrode 31, the lower surface of the wiring 35, the lower surface of the mount portion 36A of the wiring 36. In the same manner, as illustrated in FIG. 5, recesses 30Z are formed in a portion of the lower surface of the wiring 36 and a portion of the lower surface of the wiring 39. That is, in the present example, the frame portion 45, the electrode 31, and the wirings 35, 36, and 39 are thinned from the lower surface side. Thus, the thin portions 32B and 33B are formed in the electrode 31, the thin portions 37B and 38B are formed in the wiring 36, and the thin portions 40B and 41B are formed in the wiring 39. Also, the bases 32A, 33A, 37A, 38A, 40A, and 41A are formed of portions of the electrodes 31 and the wirings 35, 36, and 39 where the recesses 30Z are not formed. Formation of the recesses 30Z in the frame portions 45 also forms protrusions 45A. The thickness of the protrusion 45A is, for example, the same as the thickness of the base 32A of the body 32 of the electrode 31. Thus, the lower surface of the protrusion 45A is coplanar with the lower surface of the base 32A. The protrusions 45A are, for example, arranged at given intervals in an extension direction of each frame portion 45.

The opening 30X and the recesses 30Z described above may be formed, for example, by etching. FIG. 6 is a cross-sectional view taken along line 6-6 in FIG. 5 illustrating mainly a cross-sectional structure of the upper left one of the separate regions A1. FIGS. 7, 8, and 10 to 14 also mainly illustrate cross-sectional structures of the same portion.

In the step illustrated in FIG. 7A, a flat metal plate 30A is prepared.

In the step illustrated in FIG. 7B, a resist layer 120 including an open pattern 120X is formed on the upper surface of the metal plate 30A, and a resist layer 121 including open patterns 121X and 121Y is formed on the lower surface of the metal plate 30A. The open patterns 120X and 121X respectively expose the upper surface and the lower surface of the metal plate 30A at portions corresponding to the region in which the opening 30X (refer to FIG. 1) is formed. The open pattern 121Y exposes the lower surface of the metal plate 30A at portions corresponding to the region in which the recesses 30Z (refer to FIG. 6) are formed.

The material of the resist layers 120 and 121 may be, for example, a photosensitive dry film resist or a liquid photoresist (e.g., dry film resist or liquid resist of novolac resin or acrylic resin). For example, when a photosensitive dry film is used, the upper surface or the lower surface of the metal plate 30A is laminated with a dry film through thermocompression bonding, and the dry film is patterned through photolithography to form the resist layers 120 and 121. When a liquid photoresist is used, after applying a liquid photoresist, the resist layers 120 and 121 may be formed by the same steps.

In the step illustrated in FIG. 7C, wet etching is performed on both surfaces of the metal plate 30A using the resist layers 120 and 121 as etching masks to form the opening 30X and the recesses 30Z. For example, both surfaces of the metal plate 30A exposed from the open patterns 120X and 121X in the resist layers 120 and 121 are removed by etching to form the opening 30X. The formation of the opening 30X defines the frame portions 45, the electrodes 31, the wirings 34 including the wirings 35 and 36, and the wirings 39 (refer to FIG. 5) in each separate region A1. Also, in this step, the metal plate 30A exposed from the open pattern 121Y in the resist layer 121 is etched (half-etched) from the lower surface to a given depth so that the metal plate 30A is thinned. As a result, the recesses 30Z are formed in the metal plate 30A exposed from the open pattern 121Y, and the frame portions 45, the electrodes 31, the wirings 34, and the wirings 39 (refer to FIG. 5) are partially thinned from the lower surface. The etchant used in this step may be selected in accordance with the material of the metal plate 30A. For example, when a copper plate is used as the metal plate 30A, a ferric chloride aqueous solution or a cupric chloride aqueous solution may be used as the etchant. This step may be performed by spray etching both surfaces of the metal plate 30A.

Then, the resist layers 120 and 121 are removed, for example, by an alkaline stripping solution (e.g., organic amine stripping solution, caustic soda, acetone, or ethanol). As a result, as illustrated in FIG. 6, the opening 30X and the recesses 30Z are formed, and the metal plate 30 is formed in the separate region A1. The manufacturing steps described above manufacture the structural body illustrated in FIGS. 5 and 6.

In the present example, the opening 30X and the recesses 30Z are formed by etching. Instead, the opening 30X and the recesses 30Z may be formed by, for example, stamping.

Figure 8:
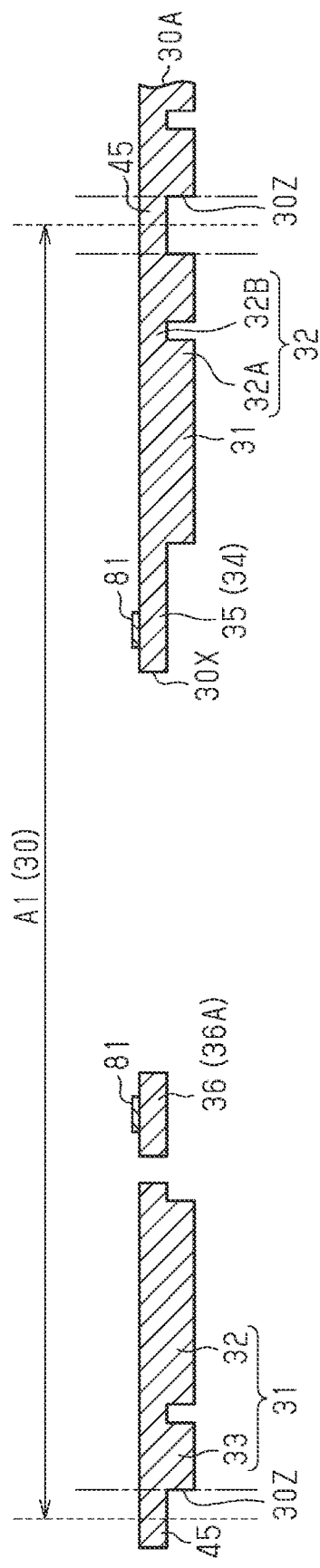
FIG. 8 is a schematic cross-sectional view illustrating a manufacturing step of the first metal plate subsequent to the step illustrated in FIG. 7C.

In the step illustrated in FIG. 8, the metal layer 81 is formed on the upper surface of the wiring 35 and the upper surface of the mount portion 36A of the wiring 36. In the present example, the metal layer 81 is partially formed on part of the upper surface of the wiring 35, and the metal layer 81 is partially formed on part of the upper surface of the mount portion 36A. The metal layer 81 is, for example, formed on the upper surface of the wirings 35 and 36 in the proximity of the peripheral edges of the mount region of the electronic component 60 (refer to FIG. 1). The metal layer 81 may be formed, for example, through an electrolytic plating process that uses the metal plate 30A as a power feeding layer. For example, the entire surface of the metal plate 30A except the formation region of the metal layer 81 is covered by a resist layer. An electrolytic plating process that uses the resist layer as a plating mask is performed to form the metal layer 81 on the metal plate 30A exposed from the resist layer. Alternatively, a sparger process may be used to form the metal layer 81. Alternatively, the metal layer 81 may be formed on the entire upper surface of the metal plate 30A.

In the step illustrated in FIG. 9, an alignment jig 55 is prepared. The alignment jig 55 includes, for example, separate regions A2 arranged in a matrix (here, 2×2) in correspondence with the separate regions A1 illustrated in FIG. 5. In the example illustrated in FIG. 9, the alignment jig 55 includes four separate regions A2. However, the number of separate regions A2 is not particularly limited. For the sake of simplicity, the following description will focus on one separate region A2.

Each separate region A2 of the alignment jig 55 includes recesses 55X. The recesses 55X are spaced apart from each other. The recesses 55X are spaced apart by a distance corresponding to the width of the opening 50X in the metal plate 50. Each recess 55X has, for example, a rectangular planar shape. The recess 55X is large enough to accommodate the electrode 51.

The electrodes 51 of the metal plate 50 are accommodated in the recesses 55X. Each electrode 51 is accommodated in the recess 55X, for example, by transferring. When accommodated in the recesses 55X, the electrodes 51 are aligned with each other on the alignment jig 55. The electrodes 51 may be formed, for example, by etching or stamping a single metal plate.

In the step illustrated in FIG. 10A, the alignment jig 55, in which the electrodes 51 are accommodated in the recesses 55X, is arranged above the metal plate 30A. In this step, the metal plate 30A and the alignment jig 55 are arranged so that the separate regions A1 and A2 overlap each other in plan view. That is, the metal plate 30A and the alignment jig 55 are arranged so that the separate regions A1 and A2 are vertically aligned with each other. For example, the metal plate 30A and the alignment jig 55 are arranged so that the electrodes 31 of the metal plate 30A face the electrodes 51. The electrode 51 accommodated in the recess 55X has a lower surface, for example, projecting downward from the lower surface of the alignment jig 55.

Subsequently, the metal plate 30A is joined to the electrodes 51. In the present example, the metal plate 30A is joined to the electrodes 51 by diffusion bonding. Diffusion bonding is performed by applying heat and pressure to the metal plate 30A and the electrodes 51 arranged on the upper surface of the metal plate 30A to join the metal plate 30A and the electrodes 51. For example, when copper is used as the material of the metal plate 30A and the electrodes 51, the heating temperature may be approximately 500° C. to 800° C., and the pressure may be approximately 0.005 to 0.015 kN/mm². The metal plate 30A and the electrodes 51 that are joined by diffusion bonding are integrated without a boundary surface. The upper surface of the metal plate 30A is directly joined to the lower surfaces of the electrodes 51.

In the frame portions 45, the protrusions 45A (refer to FIG. 5) are formed to be coplanar with the lower surfaces of the electrodes 31 and the lower surface of the wiring 36. Thus, appropriate pressure is applied to the frame portions 45 through the protrusions 45A. That is, even when the thickness of the frame portions 45 is reduced by formation of the recesses 30Z, the protrusions 45A allow for appropriate application of pressure to the frame portions 45.

The alignment jig 55 is removed from the structural body illustrated in FIG. 10A. As illustrated in FIG. 10B, this manufactures a wiring substrate in which the electrodes 51 are joined to the upper surfaces of the electrodes 31 in each separate region A1. In other words, the steps described above manufacture a large wiring substrate including continuous wiring substrates, in each of which the electrodes 51 are joined to the upper surfaces of the electrodes 31.

In the step illustrated in FIG. 11A, the electronic component 60 including the bumps 61 on the circuit formation surface is prepared. The electronic component 60 is mounted on the upper surfaces of the wirings 34 in each separate region A1. For example, the bumps 61 of the electronic component 60 are flip-chip-joined to the metal layers 81 formed on the upper surface of the wiring 35 and the upper surface of the mount portion 36A of the wiring 36 in the separate region A1.

In the step illustrated in FIG. 11B, tape 130 is adhered to the lower surface of the metal plate 30A. For example, the tape 130 has a surface on which an adhesive (not illustrated) is applied, and the surface of the tape 130 is attached to the lower surface of the metal plate 30A. For example, the lower surface of the metal plate 30A is laminated with a sheet of tape 130 through thermocompression bonding. The material of the tape 130 may have, for example, a superior chemical resistance or a superior thermal resistance. The material of the tape 130 may be, for example, a polyimide resin or a polyester resin. A material that allows for easy removal of the tape 130 from the insulation layer 70 (refer to FIG. 1), which is formed by molding in a subsequent step, may be used as the adhesive of the tape 130. The material of such an adhesive may be, for example, a silicone-base adhesive material.

Figure 12A:
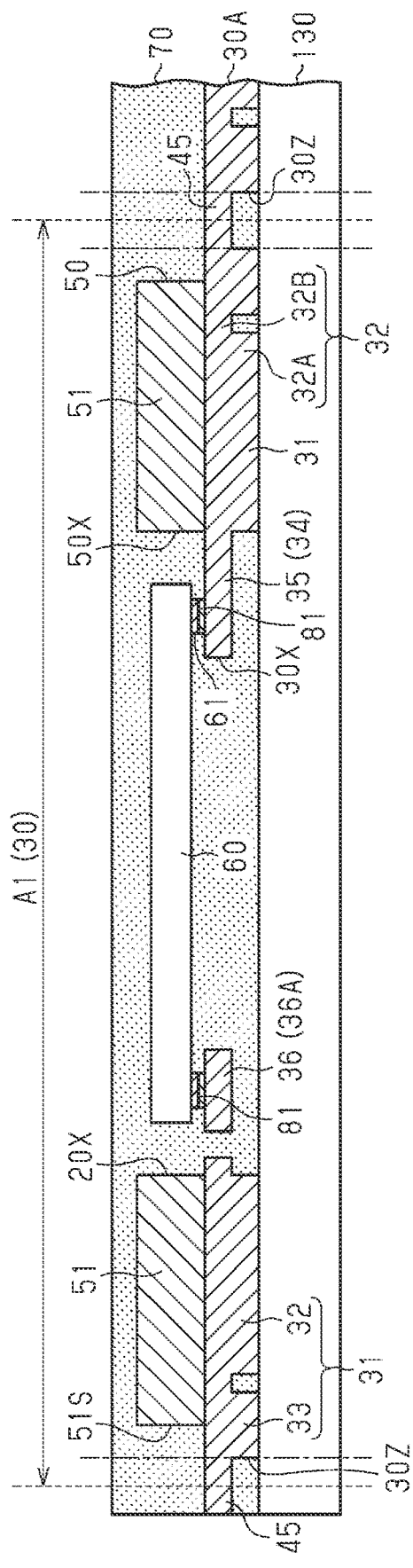

In the step illustrated in FIG. 12A, the insulation layer 70 is formed on the upper surface of the tape 130 to encapsulate the metal plate 30A, the electrodes 51, and the electronic component 60. For example, the insulation layer 70 is formed on the upper surface of the tape 130 to fill the openings 30X and 50X and the recesses 30Z and cover the upper surfaces of the electrodes 51 and the entirety of the electronic component 60. The insulation layer 70 covers the outer side surface 51S of each electrode 51. The insulation layer 70 may be formed, for example, through a resin molding process. For example, when a thermosetting mold resin is used as the material of the insulation layer 70, the structural body illustrated in FIG. 11B is accommodated in a mold. Pressure (e.g., 5 to 10 MPa) is applied to the mold, and a liquidized mold resin is drawn into the mold. Then, the mold resin is heated and cured at a temperature of approximately 180° C. to form the insulation layer 70. During the encapsulation process in this step, the tape 130 limits leakage of the mold resin to the lower surface of the metal plate 30A (may be referred to as "mold flash"). The process for filling the mold with the mold resin includes, for example, a transfer molding, a compression molding, and an injection molding.

In this step, the recesses 30Z are formed in the metal plate 30A. With this structure, resin appropriately fills an inner side region of each separate region A1 through the recesses 30Z.

Figure 12B:
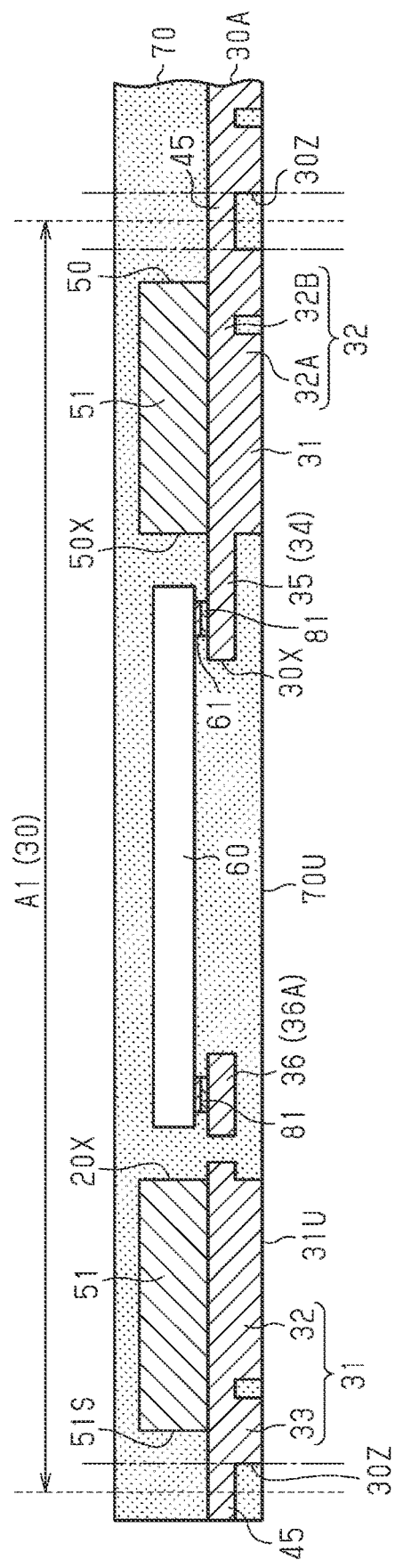

When the encapsulation process is completed, the structural body covered by the insulation layer 70 is removed from the mold. Subsequently, the tape 130 is removed from the metal plate 30A and the insulation layer 70. The tape 130 is, for example, mechanically removed from the metal plate 30A and the insulation layer 70. As a result, as illustrated in FIG. 12B, the lower surface of the metal plate 30A and the lower surface 70U of the insulation layer 70 are exposed to the exterior. The lower surface of the metal plate 30A and the lower surface 70U of the insulation layer 70, which were in contact with the upper surface of the tape 130 (refer to FIG. 12A), are substantially flush with each other. At this time, after removal of the tape 130, the adhesive of the tape 130 may partially remain on the lower surface of the metal plate 30A. Such a possible remaining adhesive may be removed, for example, by ashing (dry etching using oxygen plasma).

Figure 13A:
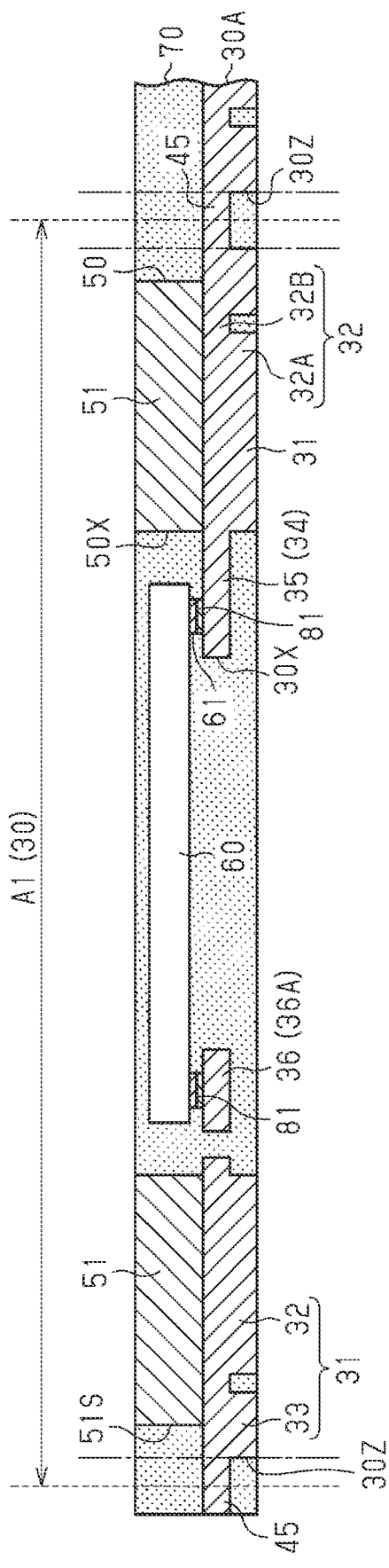

In the step illustrated in FIG. 13A, the upper surface of the insulation layer 70 is polished so that the upper surfaces of the electrodes 51 are exposed to the exterior. For example, the upper surface of the insulation layer 70 is polished so that the upper surfaces of the electrodes 51 are flush with the upper surface of the insulation layer 70. The insulation layer 70 is polished by buffing or blasting. When the lower surface of the metal plate 30A is covered by the insulation layer 70 such as mold flash, the lower surface 70U of the insulation layer 70 may also be polished to remove the mold flash.

Figure 13B:
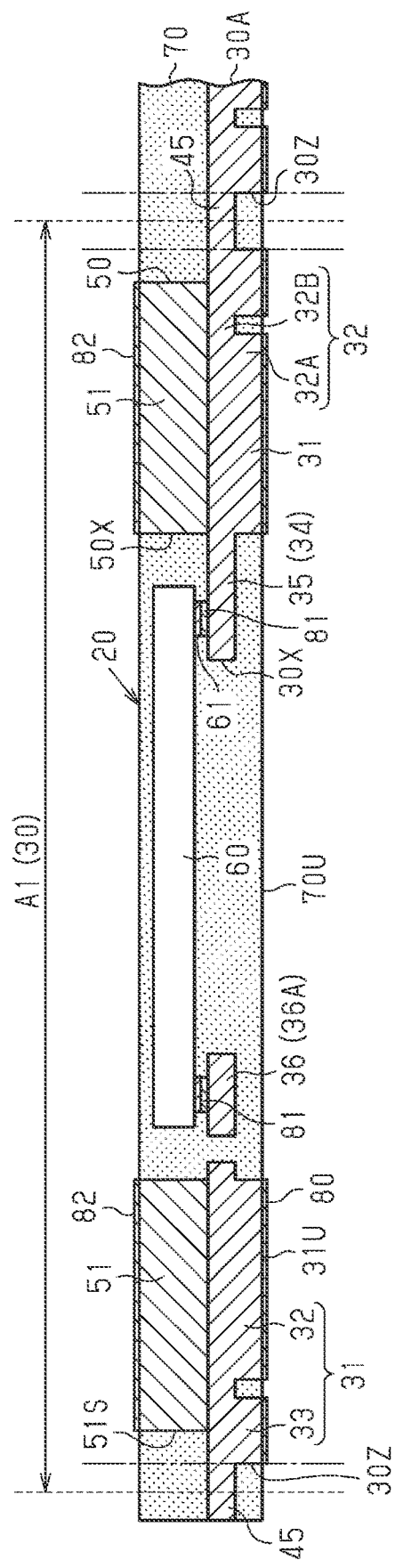

In the step illustrated in FIG. 13B, the metal layer 80 is formed on the lower surface of the metal plate 30A exposed from the insulation layer 70, and the metal layer 82 is formed on the upper surfaces of the electrodes 51 exposed from the insulation layer 70. The metal layers 80 and 82 may be formed, for example, through an electrolytic plating process that uses the metal plate 30A and the electrodes 51 as power feeding layers.

The manufacturing steps described above manufacture the structural body corresponding to the wiring substrate 20 illustrated in FIG. 1 in each separate region A1.

The insulation layer 70 and the frame portions 45 are cut in the cutting positions indicated by illustrated single-dashed lines with a dicing saw or the like to singulate the wiring substrate 20. As a result, as illustrated in FIG. 14A, the outer side surface 31S of the electrode 31, the outer side surface 70S of the insulation layer 70, and the outer side surface of the metal layer 80, which are a cut surface, are substantially flush with each other. The outer side surface 51S of the electrode 51 is covered by the insulation layer 70. That is, the outer side surface 51S of the electrode 51 is not exposed to the exterior of the wiring substrate 20. This appropriately inhibits oxidation of the outer side surface 51S of the electrode 51.

The manufacturing steps described above simultaneously manufacture a batch of wiring substrates 20. After singulation, the wiring substrate 20 may be inverted upside down and used or may be arranged at any angle.

Next, each wiring substrate 20 undergoes various electric inspections (e.g., open or short circuit). The electric inspections determine whether the wiring substrate 20 is good or defective.

In the step illustrated in FIG. 14B, the electronic component 90 is mounted on the wiring substrate 20 that has been determined to be good in the electric inspections. The electronic component 90 is mounted on the metal layer 82, which is formed on the upper surface of the electrodes 51 of the wiring substrate 20, by the joint material 91.

The manufacturing steps described above manufacture the electronic device 10 illustrated in FIG. 1. The electronic device 10 may be inverted when used or may be arranged at any angle.

The first embodiment has the advantages described below.

(1) The base 32A of the body 32 of the electrode 31 is solid, and the electrode 51 is solid. The electrode 51 is joined to the upper surface of the base 32A. This increases the area in which the electrode 31 is joined to the electrode 51 as compared to a structure in which via wirings are connected to build-up wiring layers. Thus, the electrode 31 is connected to the electrode 51 with a low resistance, thereby improving the reliability of the electric connection between the electrode 31 and the electrode 51.

(2) When heat is generated in the electronic components 60 and 90, the heat is dissipated through the electrode 31 including the solid base 32A and the solid electrode 51. The electrodes 31 and 51, which have a large volume, efficiently dissipate heat generated in the electronic components 60 and 90. As a result, increases in the temperature of the electronic components 60 and 90 are limited.

(3) The electrode 51 is diffusion-bonded to the upper surface of the electrode 31. Integration of the electrode 31 with the electrode 51 through diffusion bonding appropriately limits increases in the electric resistance of the portion connecting the electrode 31 and the electrode 51. In other words, the electrode 31 is connected to the electrode 51 with a lower resistance than when build-up wiring layers are connected by via wirings. Therefore, the reliability of the electric connection between the electrode 31 and the electrode 51 is improved.

(4) In addition, the integration of the electrode 31 with the electrode 51 through diffusion bonding directly joins the electrode 31 to the electrode 51. The electrode 31 is connected to the electrode 51 with a lower resistance than, for example, a case in which the electrode 31 is joined to the electrode 51 by a joint material. Therefore, the reliability of the electric connection between the electrode 31 and the electrode 51 is improved.

(5) The metal plate 50 includes the opening 50X that is large enough to accommodate the electronic component 60 and exposes the wiring 34 and the mount portion 36A, on which the electronic component 60 is mounted. This allows the electronic component 60 to be mounted on the metal plate 30 after the metal plate 30 is diffusion-bonded to the metal plate 50. Thus, the wiring substrate 20 is manufactured by simple manufacturing steps, thereby improving the assembly reliability of the wiring substrate 20.

(6) The outer side surface 51S of the electrode 51 is covered by the insulation layer 70. Thus, the outer side surface 51S of the electrode 51 is not exposed to the exterior of the wiring substrate 20. This appropriately inhibits oxidation of the outer side surface 51S of the electrode 51. In addition, entrance of moisture into the wiring substrate 20 from a boundary surface of the electrode 51 and the insulation layer 70 is limited. Accordingly, separation of the boundary surface of the electrode 51 and the insulation layer 70 caused by the entrance of moisture is appropriately limited.

(7) The projections 33 project from a side surface of the body 32 of the electrode 31 toward the peripheral edge of the wiring substrate 20 in a comb-teeth arrangement. With this structure, the area of the outer side surfaces 31S of the projections 33 exposed from the insulation layer 70 is smaller than the area of the side surface of the body 32.

(8) The electrode 31 includes the thin portions 32B and 33B that are thinner than the bases 32A and 33A. The thin portions 32B and 33B form a space between the tape 130 and the electrode 31. With this structure, when forming the insulation layer 70, the resin appropriately fills a region located at an inner side of the electrode 31 through the space between the tape 130 and the electrodes 31. Therefore, even when the electrode 31 includes the solid base 32A, the resin is appropriately filled.

(9) The frame portion 45 includes the recess 30Z. The recess 30Z forms a space between the tape 130 and the frame portion 45. With this structure, when forming the insulation layer 70, the resin appropriately fills a region located at an inner side of the frame portion 45 through the space between the tape 130 and the frame portion 45. Thus, the filling of resin is improved.

(10) The electronic component 90 is mounted on a position overlapping the electronic component 60 in plan view. The planar size of the electronic device 10 is reduced as compared to, for example, a structure in which electronic components are arranged next to each other on a lead frame.

(11) The metal plate 30 and the metal plate 50 may be separately manufactured. Therefore, materials of the metal plates 30 and 50 may be individually selected, and the metal plates 30 and 50 may be used in various applications.

(12) The insulation layer 70 covers the lower surfaces of the thin portions 32B and 33B, which are thinner than the bases 32A and 33A. This improves the adhesion of the insulation layer 70 to the electrode 31. Also, the insulation layer 70 covers the lower surfaces of the mount portion 36A and the thin portions 37B and 38B, which are thinner than the bases 37A and 38A. This improves the adhesion of the insulation layer 70 to the wirings 36. In addition, the insulation layer 70 covers the lower surfaces of the thin portions 40B and 41B, which are thinner than the bases 40A and 41A. This improves the adhesion of the insulation layer 70 to the wirings 39.

(13) The projection 33 of the electrode 31, the projection 38 of the wiring 36, and the projection 41 of the wiring 39 are identical in planar shape and the same in size. In addition, the openings 103Y, which are formed in correspondence with the bases 33A, 38A, and 41A of the projections 33, 38, and 41, are identical in planar shape and the same in size. This improves the mounting reliability when the electronic device 10 is mounted on the wiring substrate 100.

(14) When the electronic device 10 is mounted on the wiring substrate 100, a visual inspection is conducted on the joined portions of the electronic device 10 and the wiring substrate 100 to determine whether the electronic device 10 is appropriately mounted. In the visual inspection, for example, an image of the solder layer 112, which joins the projections 33, 38, and 41 to the wiring layers 102, is captured. The captured image undergoes an image processing that determines whether the joining state of the solder layer 112 is satisfactory. When the bases 33A, 38A, and 41A of the projections 33, 38, and 41 are identical in shape and the openings 103Y, that is, the wiring layers 102 exposed from the openings 103Y, are identical in shape, the solder layers 112 will be identical in shape if appropriately joined to the bases 33A, 38A, and 41A and the wiring layers 102. Therefore, a configuration in which the bases 33A, 38A, and 41A are identical in shape and the wiring layers 102, which are exposed from the openings 103Y, are identical in shape facilitates the determination of whether the joining state of the solder layer 112 is satisfactory in the visual inspection.

Second Embodiment

A second embodiment will now be described with reference to FIGS. 15 to 22B. The second embodiment differs from the first embodiment in that the metal plate 30 of the wiring substrate 20 includes a recess 43. The differences from the first embodiment will be mainly discussed. The same reference characters are given to those members that are the same as the corresponding members illustrated in FIGS. 1 to 14B. Such members will not be described in detail.

As illustrated in FIG. 15, recesses 43 are formed in the lower surface of each electrode 31. Each recess 43 is formed in the projection 33 of the electrode 31. The recess 43 is formed in the base 33A of the projection 33. The recess 43 is recessed from the lower surface of the base 33A toward the metal plate 50. That is, the recess 43 has a bottom surface 43A that is located at a higher position than the lower surface of the base 33A. The bottom surface 43A of the recess 43 is, for example, coplanar with the lower surface of the thin portion 32B. In other words, the recess 43 is thinned from the lower surface of the base 33A to the same level as the thin portion 32B.

Figure 16:
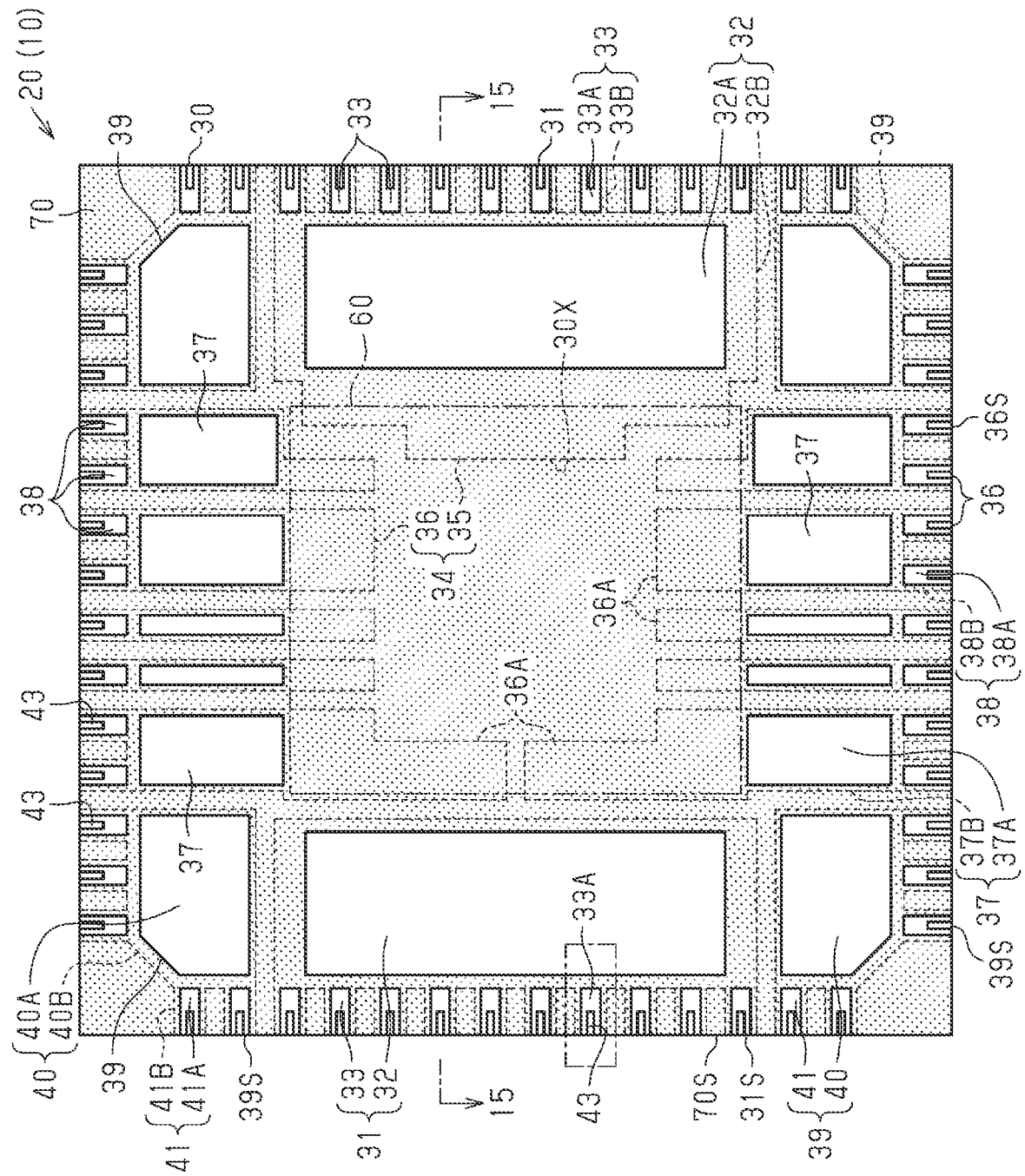
FIG. 16 is a schematic plan view of the wiring substrate illustrated in FIG. 15.
Figure 17:
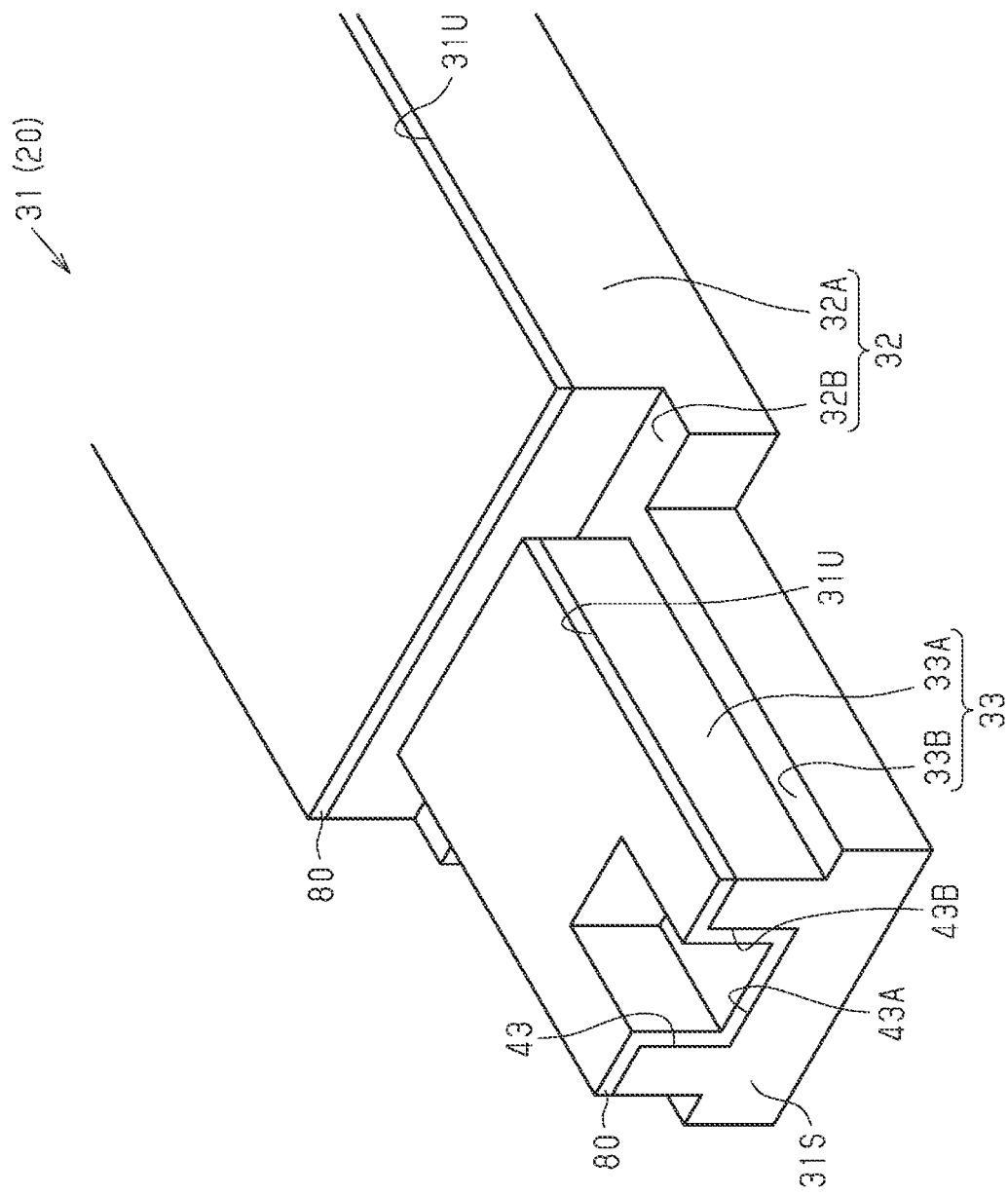
FIG. 17 is a schematic perspective view illustrating an exemplary structure of the section surrounded by the single-dashed line in FIG. 16.

As illustrated in FIGS. 16 and 17, the recess 43 extends from the outer side surface 31S of the electrode 31 toward the inner side of the wiring substrate 20 (toward the body 32). That is, the recess 43 is shaped as a cutaway portion in the outer side surface 31S of the base 33A and the lower surface 31U. In other words, the recess 43 is open toward the peripheral edge of the wiring substrate 20 and the lower surface of the wiring substrate 20. The recess 43 extends from the outer side surface 31S of the base 33A to an intermediate portion of the base 33A in the longitudinal direction (i.e., direction orthogonal to the widthwise direction of the base 33A). In other words, the recess 43 does not extend to the thin portion 32B of the electrode 31. Thus, the recess 43 is separate from the thin portion 32B. That is, the base 33A, which is thicker than the thin portion 32B, is formed between the recess 43 and the thin portion 32B. FIG. 17 is a perspective view of the section surrounded by the single-dashed line in FIG. 16 without illustrating the insulation layer 70.

As illustrated in FIG. 17, each recess 43 is formed, for example, in a widthwise intermediate portion of the base 33A. The widthwise dimension of the recess 43 is less than the widthwise dimension of the base 33A. The recess 43 does not extend to the thin portion 33B in the widthwise direction of the base 33A. Thus, the recess 43 is separate from the thin portion 33B. That is, the base 33A, which is thicker than the thin portion 33B, is formed between the recess 43 and the thin portion 33B. As described above, the recess 43 is surrounded by a wall surface 43B of the base 33A and is separate from the thin portions 32B and 33B.

As illustrated in FIG. 17, the metal layer 80 is formed on a wall defining the recess 43. The metal layer 80 is formed, for example, on the entire wall of the recess 43. The metal layer 80 is formed, for example, on the entire bottom surface 43A of the recess 43 and the entire wall surface 43B of the recess 43. The metal layer 80 is formed along the bottom surface 43A and the wall surface 43B of the recess 43. The metal layer 80 covers, for example, the entire lower surface 31U of the base 33A and the entire wall of the recess 43. The metal layer 80, for example, continuously covers the lower surface 31U of the base 33A, the wall surface 43B of the recess 43, and the bottom surface 43A of the recess 43. The metal layer 80 is not formed on the outer side surface 31S of the electrode 31.

As illustrated in FIG. 16, recesses 43 are formed, for example, in the projections 38 of the wirings 36 and the projections 41 of the wirings 39. The recesses 43 are formed, for example, in the base 38A of each projection 38. The recesses 43 are formed, for example, in the base 41A of each projection 41. That is, in the present example, the recesses 43 are formed in all of the projections 33, 38, and 41. In the same manner as the recesses 43 formed in the bases 33A, the metal layer 80 (refer to FIG. 15) is formed on walls of the recesses 43 formed in the bases 38A and 41A.

In the second embodiment, the lower surface of the electrode 31 exposed from the lower surface 70U of the insulation layer 70 (namely, lower surfaces of the bases 32A and 33A) and the wall of the recess 43 formed in the base 33A are used as connection terminals of (e.g., external connection terminals) of the electronic device 10. Also, the lower surface of the wiring 36 exposed from the lower surface 70U of the insulation layer 70 (namely, lower surfaces of the bases 37A and 38A), the wall of the recess 43 formed in the base 38A, the lower surface of the wiring 39 exposed from the lower surface 70U of the insulation layer 70 (namely, lower surfaces of the bases 40A and 41A), and the wall of the recess 43 formed in the base 41A are used as connection terminals of (e.g., external connection terminals) of the electronic device 10. When the metal layer 80 is formed on the lower surfaces of the electrode 31 and the wirings 36 and 39 and the wall of the recess 43, the metal layer 80 is included in the connection terminals (e.g., external connection terminals) of the electronic device 10.

Applicable Example of Electronic Device 10

Figure 18:
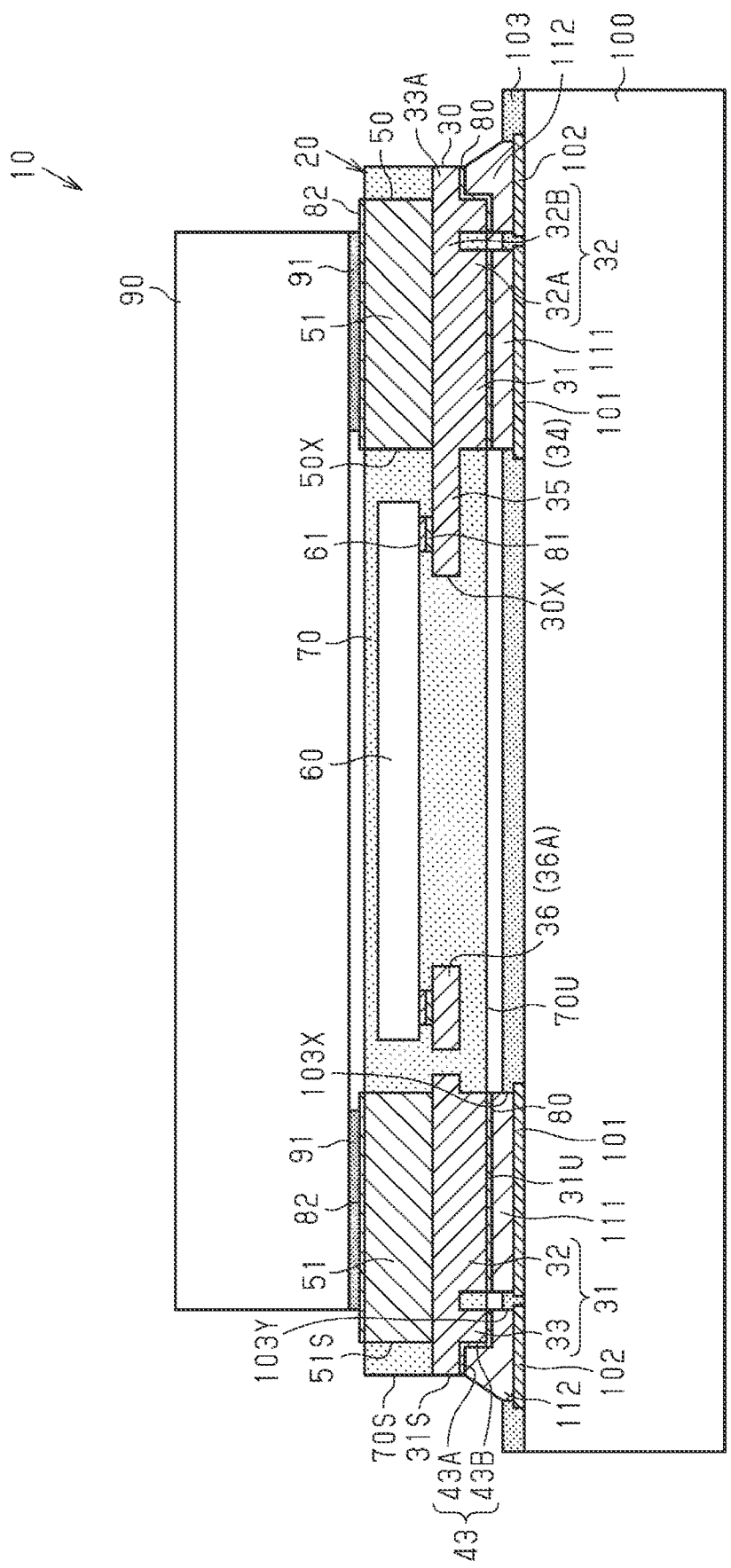
FIG. 18 is a schematic cross-sectional view of an applicable example of the electronic device illustrated in FIG. 15.

An example of a mode for mounting the electronic device 10 will now be described with reference to FIG. 18.

The electronic device 10 is, for example, mounted on the wiring substrate 100. In the electronic device 10, the base 33A of the projection 33 of the electrode 31 is joined to the wiring layer 102 by the solder layer 112. For example, the metal layer 80, which is formed on the lower surface 31U of the base 33A and the wall of the recess 43, is joined to the wiring layer 102 by the solder layer 112. At this time, the metal layer 80 is formed on the bottom surface 43A and the wall surface 43B of the recess 43 in addition to the lower surface 31U of the base 33A. That is, the metal layer 80 is formed in three dimensions. Since the metal layer 80 is three-dimensionally joined to the solder layer 112, the solder layer 112 has favorable fillets. The solder layer 112 having such a structure obtains a high joint strength. This improves the connection reliability between the electrode 31 (metal layer 80) and the wiring layer 102 as compared to a structure in which the metal layer 80 is formed on only the lower surface 31U of the base 33A. In the same manner, the base 38A of the projection 38 of the wiring 36 (refer to FIG. 16) is joined to the wiring layer 102 by the solder layer 112, and the base 41A of the projection 41 of the wiring 39 (refer to FIG. 16) is joined to the wiring layer 102 by the solder layer 112.

Manufacturing Method of Wiring Substrate 20

A method for manufacturing the wiring substrate 20 will now be described. A process for forming the recess 43 in the projection 33 and the metal layer 80 that covers the wall of the recess 43 will be described.

Figure 19A:
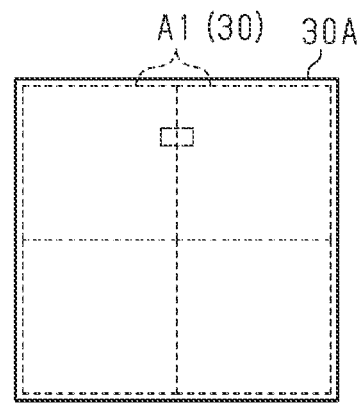
FIG. 19A is a schematic plan view of a first metal plate illustrating a method for manufacturing the wiring substrate illustrated in FIG. 15.
Figure 19B:
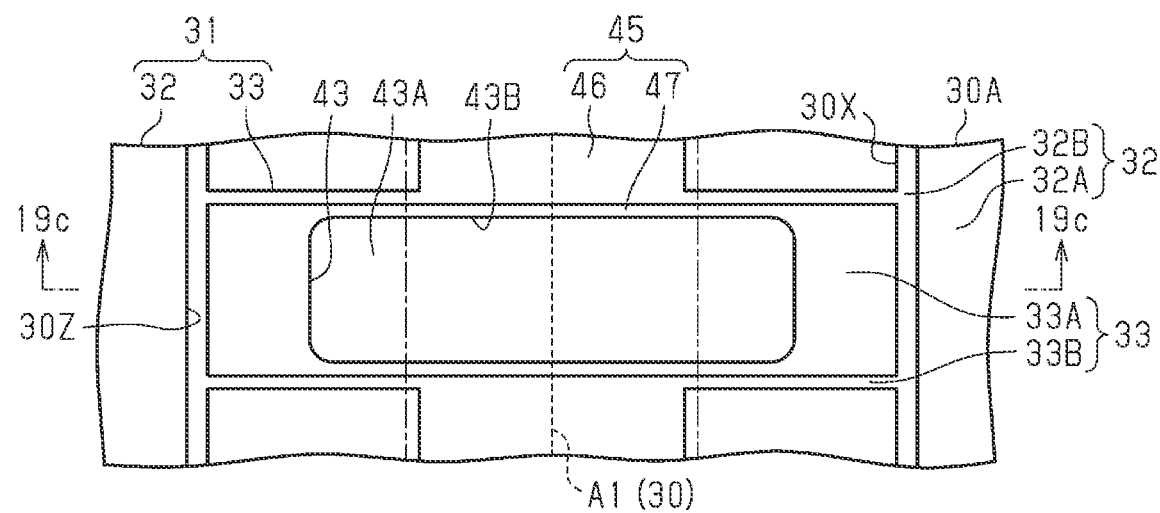
FIG. 19B is a schematic enlarged plan view illustrating a portion of FIG. 19A.
Figure 19C:
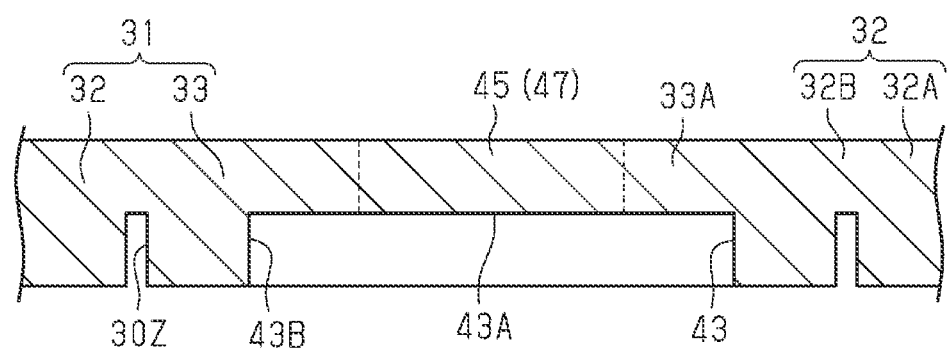
FIG. 19C is a schematic cross-sectional view taken along line 19c-19c in FIG. 19B.

Steps similar to the steps illustrated in FIGS. 5 to 7C are executed to manufacture a large metal plate 30A illustrated in FIGS. 19A to 19C. As illustrated in FIG. 19A, the metal plate 30A includes multiple separate regions A1 that are arranged in a matrix (here, 2×2). FIG. 19B is an enlarged plan view of a portion in the single-dashed line illustrated in FIG. 19A, that is, a portion that joins adjacent separate regions A1. FIG. 19C is a cross-sectional view taken along line 19c-19c in FIG. 19B. FIG. 19B is a plan view of the structural body illustrated in FIG. 19C taken from a lower side. FIGS. 20B, 21B, and 22B are also plan views illustrating planar structures as illustrated in FIG. 19B.

As illustrated in FIG. 19B, the opening 30X is formed in the metal plate 30A to form the frame portion 45 and the electrodes 31 extending from the frame portion 45 toward a center of the separate region A1 in plan view. Each electrode 31 includes the body 32, which includes the base 32A and the thin portion 32B, and the projections 33, each of which includes the base 33A and the thin portion 33B. In this state, the projections 33 of the electrode 31 formed in each separate region A1 are joined by the frame portion 45 to the projections 33 of the electrode 31 formed in an adjacent separate region A1. That is, the projections 33 in the adjacent separate regions A1 joined to each other by the frame portion 45. In the present example, the frame portion 45 includes a thin portion 46 that is continuous with the thin portion 33B and a projection 47 that is continuous with the base 33A.

The thickness of the thin portion 46 is, for example, less than the thickness of the base 33A and equal to the thickness of the thin portion 33B. The thin portion 46 is formed by partially thinning the frame portion 45 from the lower surface side using half-etching or the like. The lower surface of the thin portion 46 is, for example, flush with the lower surface of the thin portion 33B. The thin portion 46 is formed continuously and integrally with each thin portion 33B. Thus, each thin portion 33B is formed continuously and integrally with the thin portion 33B arranged in the adjacent separate region A1 through the thin portion 46. The thin portion 33B is formed continuously and integrally with the thin portion 32B of the body 32.

The projection 47 projects, for example, downward from the thin portion 46. The thickness of the projection 47 is, for example, the same as the thickness of the base 33A. The lower surface of the projection 47 is, for example, coplanar with the lower surface of the base 33A. The projection 47 is formed continuously and integrally with each base 33A. Thus, each base 33A is formed continuously and integrally with the base 33A arranged in the adjacent separate region A1 through the projection 47. The base 33A and the projection 47 are surrounded by the thin portion 32B, the thin portion 33B, and the thin portion 46.

As illustrated in FIGS. 19B and 19C, the recess 43 is formed in the base 33A and the projection 47. The recess 43 is recessed from the lower surfaces of the base 33A and the projection 47 toward the upper surfaces of the base 33A and the projection 47. The recess 43 is formed, for example, by partially thinning the base 33A and the projection 47 from the lower surface side using half-etching or the like. The bottom surface 43A of the recess 43 is, for example, coplanar with the lower surface of the thin portion 32B. The recess 43 extends from one of the two bases 33A joined by the frame portion 45 to the other base 33A through the projection 47. That is, as illustrated in FIG. 19B, the recess 43 extends across the projection 47. The recess 43 is arranged in an intermediate portion of the base 33A and the projection 47 in the widthwise direction (vertical direction in FIG. 19B). The recess 43 is separate from the thin portions 32B, 33B, and 46. That is, the base 33A and the projection 47, which are thicker than the thin portions 32B, 33B, and 46, are formed between the recess 43 and the thin portions 32B, 33B, and 46. In other words, the recess 43 is surrounded by the wall surface 43B formed by the base 33A and the projection 47.

Steps similar to the steps illustrated in FIGS. 8 to 12A are executed to manufacture the structural body illustrated in FIGS. 20A and 20B. In FIG. 20B, the tape 130 is transparent. As illustrated in FIGS. 20A and 20B, when the tape 130 is adhered to the lower surface of the metal plate 30A, the insulation layer 70 is formed on the upper surface of the tape 130 to encapsulate the metal plate 30A, the electrodes 51, and the electronic component 60. Since the lower surfaces of the bases 32A and 33A and the lower surface of the projection 47 are adhered to the tape 130, the insulation layer 70 is not formed on the lower surfaces of the bases 32A and 33A and the lower surface of the projection 47. Since the space is formed between the lower surfaces of the thin portions 32B, 33B, and 46 and the tape 130, the insulation layer 70 is formed to fill the space. As illustrated in FIG. 20B, the insulation layer 70 covers the lower surfaces of the thin portions 32B, 33B, and 46. As illustrated in FIG. 20A, the space is formed between the bottom surface 43A of the recess 43 and the tape 130. The recess 43 is surrounded by the wall surface 43B formed by the base 33A and the projection 47. The lower surfaces of the base 33A and the projection 47, which form the wall surface 43B, are adhered to the tape 130. Therefore, the insulation layer 70 is not formed in the recess 43. Thus, the bottom surface 43A and the wall surface 43B of the recesses 43 are not covered by the insulation layer 70 and are exposed from the insulation layer 70.

Figure 21A:
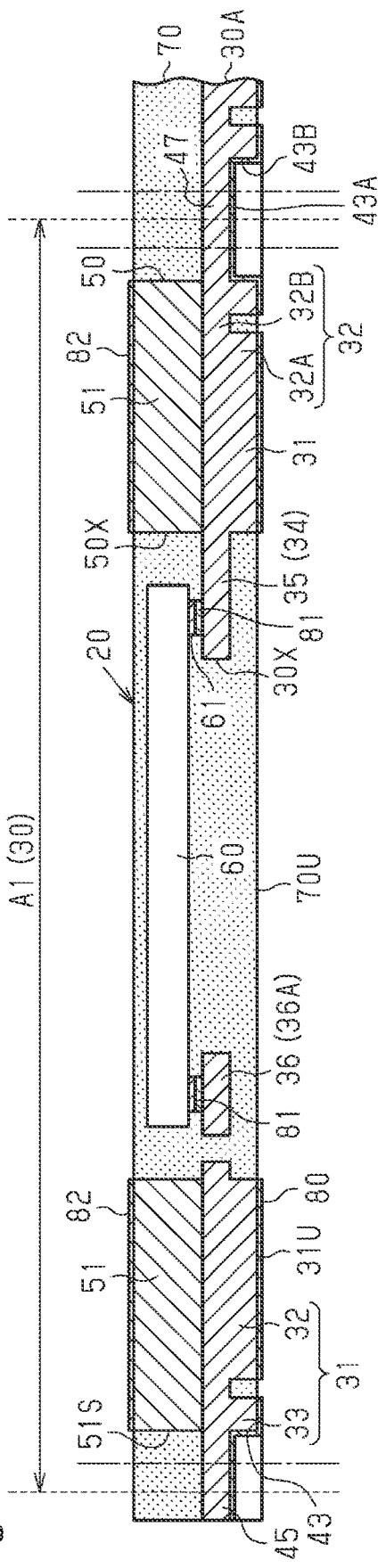
FIG. 21A is a schematic cross-sectional view illustrating a method for manufacturing the wiring substrate subsequent to the step illustrated in FIG. 20A.
Figure 21B:
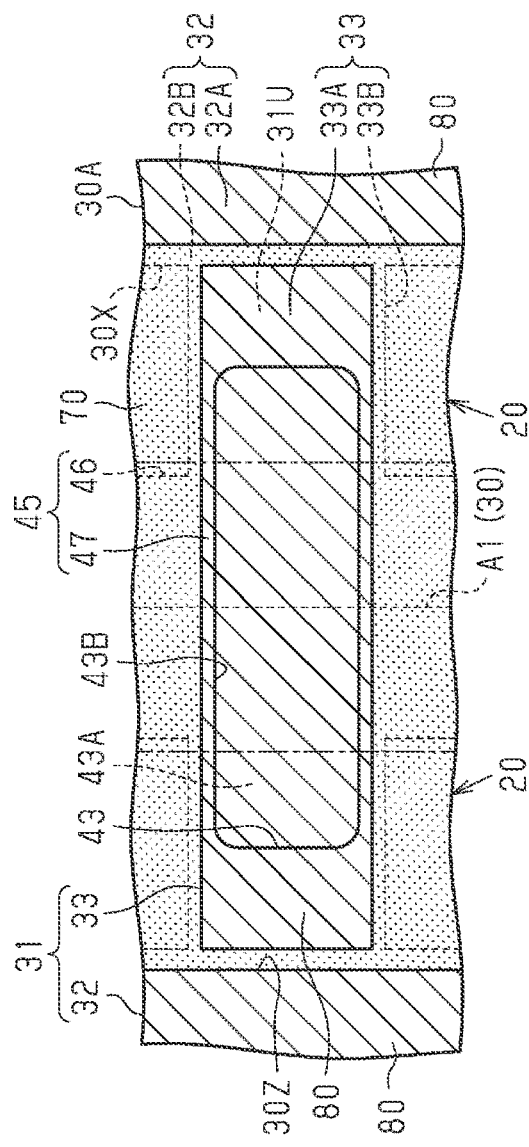
FIG. 21B is a schematic enlarged plan view illustrating a portion of FIG. 21A.

Next, steps similar to the steps illustrated in FIGS. 12B to 13B are executed to manufacture the structural body illustrated in FIGS. 21A and 21B. As illustrated in FIGS. 21A and 21B, the metal layer 80 is formed on the lower surface of the metal plate 30A exposed from the insulation layer 70. The metal layer 80 is formed on the lower surface of the base 33A of the projection 33 and the entire wall of the recess 43. That is, the metal layer 80 continuously covers the lower surface 31U of the base 33A, the lower surface of the projection 47, the wall surface 43B of the recess 43, and the bottom surface 43A of the recess 43. The metal layer 80 is also formed on the lower surface 31U of the base 32A of the body 32.

The manufacturing steps described above manufacture the structural body corresponding to the wiring substrate 20 illustrated in FIG. 15 in each separate region A1.

Figure 22A:
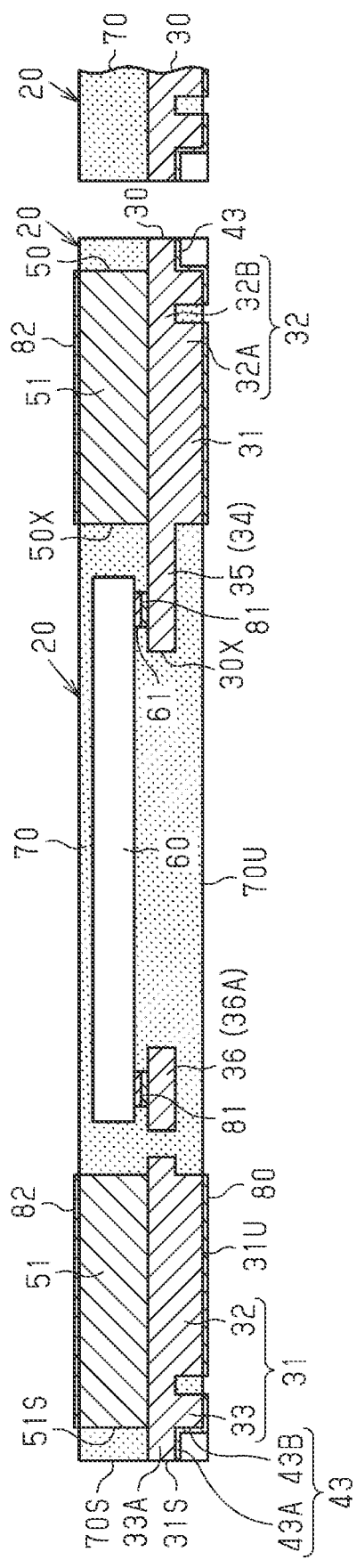
FIG. 22A is a schematic cross-sectional view illustrating a method for manufacturing the wiring substrate subsequent to the step illustrated in FIG. 21A.
Figure 22B:
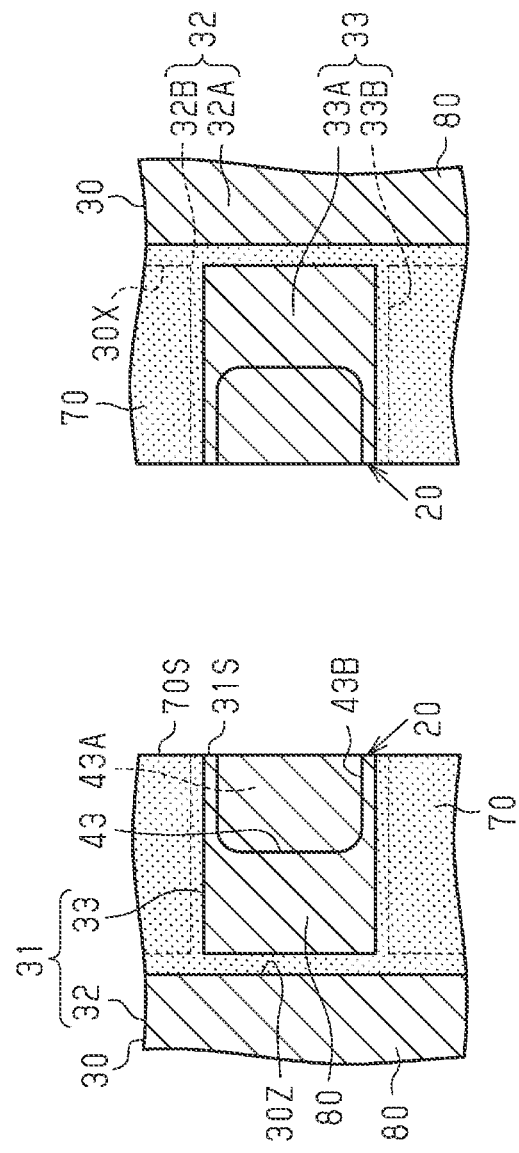
FIG. 22B is a schematic enlarged plan view illustrating a portion of FIG. 22A.

Then, in the same manner as the step illustrated in FIG. 14A, the insulation layer 70, the frame portion 45, and the metal layer 80 are cut with a dicing saw or the like in the cutting positions indicated by the single-dashed lines in FIGS. 21A and 21B to singulate the wiring substrate 20. As a result, each recess 43 illustrated in FIGS. 21A and 21B is divided into recesses 43 shaped as cutaway portions as illustrated in FIGS. 22A and 22B. In the wiring substrate 20, each recess 43 is open toward the peripheral edge of the wiring substrate 20 and the lower surface of the wiring substrate 20. In this step, the outer side surface 31S of the electrode 31, the outer side surface 70S of the insulation layer 70, and the outer side surface of the metal layer 80 formed on the bottom surface 43A of the recess 43, which are a cut surface, are substantially flush with each other.

The manufacturing steps described above simultaneously manufacture a batch of wiring substrates 20. After singulation, the wiring substrate 20 may be inverted upside down and used or may be arranged at any angle.

The second embodiment has the following advantages in addition to the advantages (1) to (14) of the first embodiment.

(15) The recess 43 is formed in the lower surface of the projection 33 of the electrode 31 at a widthwise intermediate portion of the projection 33. The metal layer 80 continuously covers the lower surface 31U of the electrode 31 and the wall of the recess 43. In this structure, the metal layer 80 is formed in three dimensions. Since the metal layer 80 is three-dimensionally joined to, for example, the solder layer 112, the solder layer 112 has favorable fillets. The solder layer 112 having such a structure obtains a high joint strength. This improves the connection reliability between the electrode 31 (metal layer 80) and the wiring layer 102 as compared to a structure in which the metal layer 80 is formed on only the lower surface 31U of the electrode 31.

It should be apparent to those skilled in the art that the foregoing embodiments may be implemented in many other specific forms without departing from the scope of this disclosure. Particularly, it should be understood that the foregoing embodiments may be implemented in the following forms.

The embodiments may be modified as follows. The embodiments and the following modified examples may be combined as long as the combined modified examples remain technically consistent with each other.

In the manufacturing process described in the embodiments, after the wiring substrate 20 is singulated, the electronic component 90 is mounted on the wiring substrate 20. However, there is no limitation to such a configuration.

For example, as illustrated in FIG. 23, before the wiring substrate 20 is singulated, the electronic component 90 may be mounted on the upper surfaces of the electrodes 51 in each separate region A1. In this case, after the electronic component 90 is mounted, the insulation layer 70 and the frame portions 45 are cut in the cutting positions indicated by illustrated single-dashed lines with a dicing saw or the like to singulate the electronic device 10.

Figure 24:
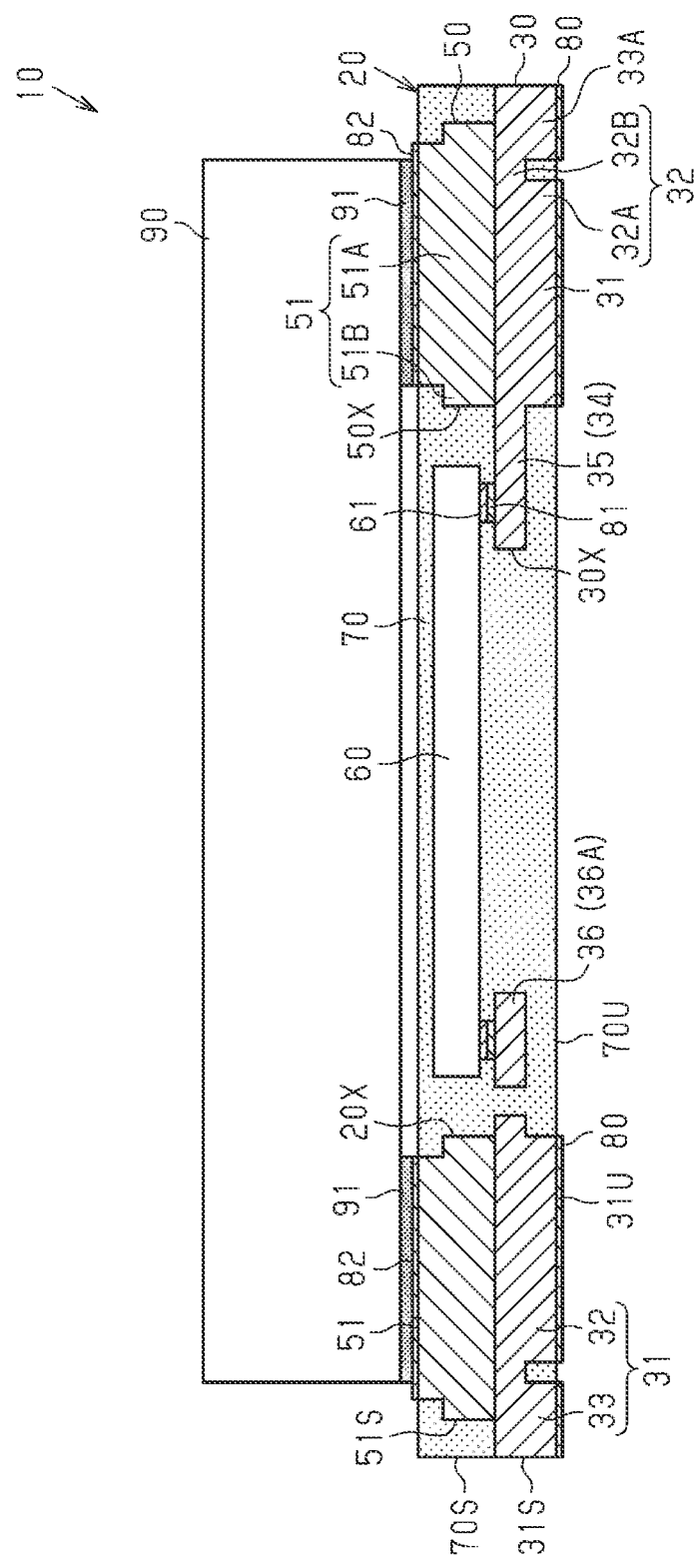
FIG. 24 is a schematic cross-sectional view illustrating a modified example of an electronic device.

For example, as illustrated in FIG. 24, the electrode 51 may be changed to a structure including a base 51A and a thin portion 51B. The base 51A is solid. The base 51A has, for example, a given width extending along a side of the contour of the wiring substrate 20 and solidly extends from a peripheral edge of the wiring substrate 20 toward the inner side of the wiring substrate 20.

The thin portion 51B projects, for example, outward from a side surface of the base 51A. The thin portion 51B projects, for example, from a side surface of the base 51A toward the inner side of the wiring substrate 20. The thin portion 51B projects, for example, from a side surface of the base 51A in the peripheral direction of the wiring substrate 20. The thin portion 51B projects, for example, from a side surface of the base 51A toward a peripheral edge of the wiring substrate 20. In the present example, the thin portion 51B projects from the all side surfaces of the base 51A.

The thin portion 51B is, for example, thinner than the base 51A. The thickness of the thin portion 51B may be set to, for example, approximately 0.3 to 0.7 times the thickness of the base 51A. The thin portion 51B is recessed from the upper surface of the base 51A toward the metal plate 30. That is, the lower surface of the thin portion MB is substantially flush with the lower surface of the base 51A, and the upper surface of the thin portion 51B is located at a lower position than the upper surface of the base 51A. The upper surface of the thin portion 51B is covered by the insulation layer 70.

In this structure, the insulation layer 70 covers the upper surface of the thin portion 51B of the electrode 51. This improves the adhesion of the insulation layer 70 to the electrode 51. Also, the side surface of the base 51A and the upper surface of the thin portion 51B form a step in a side surface of the electrode 51. This increases the length of the boundary surface of the electrode 51 and the insulation layer 70 on the side surface of the electrode 51, thereby appropriately limiting entrance of moisture into the wiring substrate 20 from the boundary surface of the electrode 51 and the insulation layer 70.

In the embodiments, the metal plate 30 is joined to the metal plate 50 by diffusion bonding. However, the process for joining the metal plates 30 and 50 is not limited to diffusion bonding. For example, the metal plate 30 and the metal plate 50 may be joined by a conductive joint material. The joint material may be, for example, solder, a conductive paste such as a silver paste, or a brazing metal. Solder may be, for example, a lead-free solder. Examples of lead-free solder include a Sn—Ag base, a Sn—Cu base, a Sn—Ag—Cu base, or a Sn—Zn—Bi base solder.

In the embodiments, a single electronic component 90 is mounted on the wiring substrate 20. Instead, multiple electronic components may be mounted on the wiring substrate 20.

In the embodiments, the recesses 30Z may be omitted from the metal plates 30 and 30A. For example, the thin portions 32B, 33B, 37B, 38B, 40B, and 41B may be omitted from the metal plates 30 and 30A.

In the embodiments, the metal layers 80, 81, 82 may be formed through an electrolytic plating process. Instead, the metal layers 80, 81, and 82 may be formed through an electroless plating process.

In the embodiments, the metal layers 80, 81, and 82 may be omitted.

In the embodiments, the electronic component 60, the insulation layer 70, and the metal layers 80, 81, and 82 may be omitted from the wiring substrate 20. That is, the wiring substrate 20 may include only the metal plate 30 and the metal plate 50. For example, the structural body manufactured by the step illustrated in FIG. 10B may be used as the wiring substrate 20.

In the embodiments, the number of electronic components 60 incorporated in the wiring substrate 20 is not particularly limited. For example, two or more electronic components 60 may be mounted on the upper surface of the metal plate 30. Electronic components incorporated in the wiring substrate 20 are not limited to one kind. Different kinds of electronic components may be incorporated.

In the embodiments, the mode of mounting the electronic components 60 and 90 may be modified or changed in various manners. The mode of mounting the electronic components 60 and 90 may be, for example, flip-chip mounting, wire bonding mounting, solder mounting, or a combination of these.

In the electronic device 10 of the embodiments, the electronic component 90 mounted on the upper surface of the metal plate 50 may be encapsulated with a resin such as a mold resin. That is, an encapsulation resin may be formed on the upper surface of the wiring substrate 20 to encapsulate the electronic component 90.

The structure of the wiring substrate 20 in the embodiments is not particularly limited. In the embodiments, two layers, namely, the metal plates 30 and 50, are stacked. Instead, for example, three or more metal layers may be stacked. The layout and planar shape of the electrodes 31 and 51 and the wirings 34, 35, 36, and 39 may be modified and changed in various manners.

In the embodiments, the metal plate 50 includes only the electrodes 51. However, there is no limitation to such a configuration. For example, the metal plate 50 may include the electrodes 51 and wirings other than the electrodes 51.

In the above embodiment, a method for manufacturing a batch of wiring substrates is embodied. Instead, a method for manufacturing a single wiring substrate (one wiring substrate) may be embodied.

CLAUSES

This disclosure further encompasses the following embodiments.

1. A method for manufacturing a wiring substrate, the method, including:

stamping or etching a metal plate to form a first metal plate including a solid first electrode, a wiring, and a mount portion for an electronic component, the mount portion including an upper surface of the wiring; and joining a solid second electrode on an upper surface of the first electrode.

2. The method according to clause 1, in which the joining a solid second electrode includes diffusion-bonding the second electrode to the upper surface of the first electrode, the method, further including:

after diffusion-boding the second electrode to the upper surface of the first electrode, mounting the electronic component on the mount portion exposed from the second electrode; and forming an insulation layer that fills a space among the first metal plate, the second electrode, and the electronic component and covers the electronic component.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A wiring substrate, comprising:
    a first metal plate including a first electrode, a wiring, and a mount portion for an electronic component, the mount portion including an upper surface of the wiring; and
    a second electrode joined to an upper surface of the first electrode, wherein the second electrode is solid,
    wherein the first electrode includes a body that is solid, and projections projecting from a side surface of the body toward a peripheral edge of the wiring substrate in a comb-teeth arrangement, the body including a base and a thin portion that is thinner than the base and projects outward from a side surface of the base, each projection including a base and a thin portion that is thinner than the base of a corresponding one of the projections and projects from a side surface of the base of the corresponding one of the projections toward the peripheral edge of the wiring substrate.

2. The wiring substrate according to claim 1, wherein the second electrode is diffusion-bonded to the upper surface of the first electrode.

3. The wiring substrate according to claim 1, wherein a portion of the wiring extends from the thin portion of the body.

4. The wiring substrate according to claim 3, wherein the upper surface of the wiring, an upper surface of the thin portion of the body, and an upper surface of the base of the body are flush with each other, and a lower surface of the wiring and a lower surface of the thin portion of the body are located at a higher position than a lower surface of the base of the body.

5. The wiring substrate according to claim 1, wherein an upper surface of the thin portion of each of the projections is flush with an upper surface of the base of a corresponding one of the projections, and a lower surface of the thin portion of each of the projections is located at a higher position than a lower surface of the base of a corresponding one of the projections.

6. The wiring substrate according to claim 1, wherein the second electrode includes a base, and a thin portion that is thinner than the base of the second electrode and projects outward from a side surface of the base of the second electrode.

7. The wiring substrate according to claim 6, wherein a lower surface of the thin portion of the second electrode is flush with a lower surface of the base of the second electrode, and an upper surface of the thin portion of the second electrode is located at a lower position than an upper surface of the base of the second electrode.

8. The wiring substrate according to claim 1, wherein the projections each have a lower surface including a recess, and the recess is open toward the peripheral edge of the wiring substrate and a lower surface of the wiring substrate.

9. The wiring substrate according to claim 1, further comprising:
    an electronic component mounted on the mount portion; and
    an insulation layer filling a space among the first metal plate, the second electrode, and the electronic component and covering the electronic component,
        wherein an upper surface of the second electrode includes an electrode pad exposed from the insulation layer.

10. The wiring substrate according to claim 9, wherein a lower surface of the first electrode includes a connection terminal exposed from the insulation layer, and a lower surface of the wiring includes a connection terminal exposed from the insulation layer.

11. The wiring substrate according to claim 9, wherein an outer side surface of the second electrode is covered by the insulation layer.

12. An electronic device, comprising:
    the wiring substrate according to claim 9; and
    an electronic component mounted on an upper surface of the electrode pad.

* * * * *